United States Patent
Castelli et al.

(10) Patent No.: US 10,552,109 B2
(45) Date of Patent: *Feb. 4, 2020

(54) METHODS FOR ASSESSING RELIABILITY OF A UTILITY COMPANY'S POWER SYSTEM

(71) Applicant: General Electric Technology GmbH, Baden (CH)

(72) Inventors: Gennaro Castelli, Bothell, WA (US); Michael Hackett, Kirkland, WA (US); Michael Quinn Howard, Bothell, WA (US); Lawrence Edmund Jones, Washington, DC (US); HuiChu Su Shung, Bellevue, WA (US); Heath Daniel Brand, Sammamish, WA (US)

(73) Assignee: General Electric Technology GmbH, Baden (CH)

( * ) Notice: Subject to any disclaimer, the term of this patent is extended or adjusted under 35 U.S.C. 154(b) by 898 days.

This patent is subject to a terminal disclaimer.

(21) Appl. No.: 15/151,984

(22) Filed: May 11, 2016

(65) Prior Publication Data
US 2016/0328199 A1 Nov. 10, 2016

Related U.S. Application Data

(63) Continuation of application No. 13/590,321, filed on Aug. 21, 2012, now Pat. No. 9,367,936, which is a
(Continued)

(51) Int. Cl.
G06F 3/0481 (2013.01)
G06F 3/0482 (2013.01)
(Continued)

(52) U.S. Cl.
CPC .............. G06F 3/14 (2013.01); G01R 31/40 (2013.01); G06F 3/0482 (2013.01);
(Continued)

(58) Field of Classification Search
CPC ........ G06F 8/34; G06F 3/0481; G06F 3/0482; G06F 3/0483; G06F 3/04847; G06F 3/04817; H04N 5/44543
See application file for complete search history.

(56) References Cited

U.S. PATENT DOCUMENTS 1,156,131 A 10/1915 Braddock
3,932,735 A 1/1976 Giras
(Continued)

FOREIGN PATENT DOCUMENTS

CN 101478157 A 7/2009

OTHER PUBLICATIONS

European Office Action dated Jul. 26, 2017 for European Application No. 08782097.3, 3 pages.
(Continued)

*Primary Examiner* — Arpan P. Savla
*Assistant Examiner* — Erik V Stitt
(74) *Attorney, Agent, or Firm* — Fitch Even Tabin & Flannery LLP

(57) ABSTRACT

Methods are provided for assessing reliability of a power system of a utility company. At least one main overview display is obtained. Violation markers are displayed on the one main overview display. A monitored elements tab is updated with a list of monitored elements.

20 Claims, 18 Drawing Sheets

Related U.S. Application Data continuation of application No. 12/139,194, filed on Jun. 13, 2008, now Pat. No. 8,321,804.

(60) Provisional application No. 60/952,021, filed on Jul. 26, 2007.

(51) Int. Cl.

| | | |
|---|---|---|
| *G06F 3/14* | (2006.01) | |
| *G06Q 10/06* | (2012.01) | |
| *H02J 3/00* | (2006.01) | |
| *G06T 3/40* | (2006.01) | |
| *G06T 11/20* | (2006.01) | |
| *G06T 11/60* | (2006.01) | |
| *G08B 23/00* | (2006.01) | |
| *H04L 12/26* | (2006.01) | |
| *G06F 3/0484* | (2013.01) | |
| *G06F 3/16* | (2006.01) | |
| *G09G 5/377* | (2006.01) | |
| *G01R 31/40* | (2014.01) | |
| *G06F 3/0486* | (2013.01) | |

(52) U.S. Cl.
CPC ........ *G06F 3/0486* (2013.01); *G06F 3/04842* (2013.01); *G06F 3/167* (2013.01); *G06Q 10/063* (2013.01); *G06Q 10/06315* (2013.01); *G06T 3/40* (2013.01); *G06T 11/206* (2013.01); *G06T 11/60* (2013.01); *G08B 23/00* (2013.01); *G09G 5/377* (2013.01); *H02J 3/00* (2013.01); *H02J 3/008* (2013.01); *H04L 43/045* (2013.01); *H02J 2003/001* (2013.01); *H02J 2003/007* (2013.01); *Y02E 60/76* (2013.01); *Y04S 40/22* (2013.01); *Y04S 50/10* (2013.01)

(56) References Cited

U.S. PATENT DOCUMENTS

| | | | |
|---|---|---|---|
| 4,075,699 A | | 2/1978 | Schneider et al. |
| 4,078,260 A | | 3/1978 | Chen et al. |
| 4,125,782 A | | 11/1978 | Pollnow, Jr. |
| 4,181,950 A | | 1/1980 | Carter, II |
| 4,204,127 A | | 5/1980 | Carter, II |
| 4,264,960 A | | 4/1981 | Gurr |
| 4,341,345 A | | 7/1982 | Hammer et al. |
| 4,347,575 A | | 8/1982 | Gurr et al. |
| 4,347,576 A | | 8/1982 | Kensinger et al. |
| 4,398,141 A | * | 8/1983 | Brennen ............... H02J 3/1864 323/211 |
| 4,455,614 A | | 6/1984 | Martz et al. |
| 4,551,812 A | | 11/1985 | Gurr et al. |
| 4,560,835 A | | 12/1985 | Bourgonje |
| 4,760,531 A | | 7/1988 | Yasui et al. |
| 4,804,938 A | | 2/1989 | Rouse et al. |
| 4,876,854 A | | 10/1989 | Owens |
| 5,136,497 A | | 8/1992 | Coe et al. |
| 5,185,886 A | | 2/1993 | Edem et al. |
| 5,384,697 A | | 1/1995 | Pascucci |
| 5,414,640 A | | 5/1995 | Seem |
| 5,422,561 A | * | 6/1995 | Williams ............... H02J 3/1821 307/31 |
| 5,444,618 A | | 8/1995 | Seki et al. |
| 5,467,265 A | | 11/1995 | Yamada et al. |
| 5,568,019 A | | 10/1996 | Mason |
| 5,594,659 A | * | 1/1997 | Schlueter ............... H02J 3/1871 307/18 |
| 5,598,566 A | | 1/1997 | Pascucci et al. |
| 5,655,136 A | | 8/1997 | Morgan |
| 5,729,731 A | | 3/1998 | Yajima et al. |
| 5,796,628 A | | 8/1998 | Chiang et al. |
| 5,798,939 A | | 8/1998 | Ochoa et al. |
| 5,904,727 A | | 5/1999 | Prabhakaran |
| 5,933,355 A | | 8/1999 | Deb |
| 5,937,414 A | | 8/1999 | Souder et al. |
| 5,963,457 A | | 10/1999 | Kanoi et al. |
| 5,974,403 A | | 10/1999 | Takriti et al. |
| 6,021,402 A | | 2/2000 | Takriti |
| 6,084,565 A | | 7/2000 | Kiya |
| 6,169,981 B1 | | 1/2001 | Werbos |
| 6,178,362 B1 | | 1/2001 | Woolard et al. |
| 6,259,972 B1 | * | 7/2001 | Sumic ............... H02H 1/0092 700/286 |
| 6,289,267 B1 | | 9/2001 | Alexander et al. |
| 6,313,752 B1 | * | 11/2001 | Corrigan ............... H02H 7/263 324/76.13 |
| 6,353,847 B1 | | 3/2002 | Maruyama et al. |
| 6,388,684 B1 | | 5/2002 | Iwamura et al. |
| 6,492,801 B1 | * | 12/2002 | Sims ............... H02J 3/1885 324/142 |
| 6,512,966 B2 | | 1/2003 | Lof et al. |
| 6,528,957 B1 | | 3/2003 | Luchaco |
| 6,549,880 B1 | | 4/2003 | Willoughby et al. |
| 6,577,962 B1 | | 6/2003 | Afshari |
| 6,591,255 B1 | | 7/2003 | Tatum et al. |
| 6,620,327 B2 | | 9/2003 | Haddock |
| 6,671,585 B2 | | 12/2003 | Lof et al. |
| 6,681,154 B2 | | 1/2004 | Nierlich et al. |
| 6,681,156 B1 | | 1/2004 | Weiss |
| 6,741,485 B1 | | 5/2004 | Runkle et al. |
| 6,804,255 B1 | | 10/2004 | Zheng et al. |
| 6,813,525 B2 | | 11/2004 | Reid et al. |
| 6,833,844 B1 | | 12/2004 | Shiota et al. |
| 6,885,915 B2 | | 4/2005 | Rehtanz et al. |
| 6,901,347 B1 | | 5/2005 | Murray et al. |
| 6,924,628 B2 | * | 8/2005 | Thompson ............... H02P 9/006 322/20 |
| 6,925,385 B2 | | 8/2005 | Ghosh et al. |
| 6,927,503 B2 | | 8/2005 | Enis et al. |
| 6,961,641 B1 | | 11/2005 | Forth et al. |
| 6,963,802 B2 | | 11/2005 | Enis et al. |
| 6,965,454 B1 | | 11/2005 | Silverbrook et al. |
| 7,058,522 B2 | | 6/2006 | Chen |
| 7,067,937 B2 | | 6/2006 | Enish et al. |
| 7,085,660 B2 | | 8/2006 | Mansingh et al. |
| 7,089,089 B2 | * | 8/2006 | Cumming ............... G01D 4/004 700/295 |
| 7,127,327 B1 | | 10/2006 | O'Donnell et al. |
| 7,177,727 B2 | | 2/2007 | Chu et al. |
| 7,177,728 B2 | | 2/2007 | Gardner |
| 7,194,338 B2 | | 3/2007 | Schlueter et al. |
| 7,233,843 B2 | | 6/2007 | Budhraja et al. |
| 7,274,975 B2 | | 9/2007 | Miller |
| 7,283,930 B2 | | 10/2007 | Flynn |
| 7,305,282 B2 | | 12/2007 | Chen |
| 7,308,361 B2 | | 12/2007 | Enis et al. |
| 7,313,465 B1 | | 12/2007 | O'Donnell |
| 7,343,226 B2 | | 3/2008 | Ehlers et al. |
| 7,343,360 B1 | | 3/2008 | Ristanovic et al. |
| 7,349,765 B2 | | 3/2008 | Reaume et al. |
| 7,430,534 B2 | | 9/2008 | Lof et al. |
| 7,444,189 B1 | | 10/2008 | Marhoefer |
| 7,454,270 B2 | | 11/2008 | Mansingh et al. |
| 7,454,717 B2 | | 11/2008 | Hinckley et al. |
| 7,509,190 B2 | | 3/2009 | Emery et al. |
| 7,519,438 B2 | | 4/2009 | Barbour et al. |
| 7,558,703 B2 | | 7/2009 | Stoupis et al. |
| 7,610,214 B1 | | 10/2009 | Dwarakanath et al. |
| 7,626,497 B2 | | 12/2009 | Mollenkopf |
| 7,627,453 B2 | * | 12/2009 | Keefe ............... G05B 23/0267 345/589 |
| 7,689,323 B2 | | 3/2010 | Mansingh et al. |
| 7,689,394 B2 | | 3/2010 | Furem et al. |
| 7,693,670 B2 | | 4/2010 | Durling et al. |
| 7,774,307 B2 | | 8/2010 | Ju et al. |
| 7,783,390 B2 | | 8/2010 | Miller |
| 7,831,569 B2 | | 11/2010 | Bestgen et al. |
| 7,873,442 B2 | | 1/2011 | Tsui |
| 7,953,519 B2 | | 5/2011 | Hamilton, II et al. |
| 7,974,742 B2 | | 7/2011 | Enis et al. |
| 8,019,445 B2 | | 9/2011 | Marhoefer |
| 8,019,697 B2 | | 9/2011 | Ozog |
| 8,041,467 B2 | | 10/2011 | Black et al. |

(56) References Cited

U.S. PATENT DOCUMENTS

| | | |
|---|---|---|
| 8,090,556 B2* | 1/2012 | Keefe .............. G05B 23/0267 700/22 |
| 8,126,685 B2 | 2/2012 | Nasle |
| 8,131,401 B2 | 3/2012 | Nasle |
| 8,222,765 B2 | 7/2012 | Collins et al. |
| 8,280,799 B2 | 10/2012 | Bing |
| 8,396,572 B2 | 3/2013 | Torzhkov et al. |
| 8,401,710 B2 | 3/2013 | Budhraja et al. |
| 8,442,698 B2 | 5/2013 | Fahimi et al. |
| 8,463,450 B2 | 6/2013 | Martin |
| 8,494,685 B2 | 7/2013 | Shaffer |
| 8,494,774 B2 | 7/2013 | Pasken et al. |
| 8,540,020 B2 | 9/2013 | Stone et al. |
| 8,600,571 B2 | 12/2013 | Dillon et al. |
| 8,866,334 B2 | 10/2014 | Donnelly et al. |
| 9,207,993 B2 | 12/2015 | Jain |
| 10,122,166 B2 | 11/2018 | Zhou et al. |
| 2001/0045949 A1 | 11/2001 | Chithambaram et al. |
| 2002/0019802 A1 | 2/2002 | Malme et al. |
| 2002/0029097 A1 | 3/2002 | Pionzio et al. |
| 2002/0032535 A1 | 3/2002 | Alexander et al. |
| 2002/0042789 A1 | 4/2002 | Michalewicz et al. |
| 2002/0046157 A1 | 4/2002 | Solomon |
| 2002/0085326 A1 | 7/2002 | Kim et al. |
| 2002/0103745 A1 | 8/2002 | Lof et al. |
| 2002/0198629 A1 | 12/2002 | Ellis |
| 2003/0036820 A1 | 2/2003 | Yellepeddy et al. |
| 2003/0050738 A1 | 3/2003 | Masticola et al. |
| 2003/0055776 A1 | 3/2003 | Samuelson |
| 2003/0056126 A1 | 3/2003 | O'connor et al. |
| 2003/0115306 A1 | 6/2003 | Hagarty et al. |
| 2003/0158631 A1 | 8/2003 | Masuda et al. |
| 2003/0171851 A1 | 9/2003 | Brickfiled et al. |
| 2004/0020206 A1 | 2/2004 | Sullivan et al. |
| 2004/0031059 A1 | 2/2004 | Bialk et al. |
| 2004/0044442 A1 | 3/2004 | Bayoumi et al. |
| 2004/0093124 A1 | 5/2004 | Havlena |
| 2004/0117330 A1 | 6/2004 | Ehlers et al. |
| 2004/0139038 A1 | 7/2004 | Ehlers et al. |
| 2004/0158360 A1 | 8/2004 | Garland et al. |
| 2004/0162675 A1 | 8/2004 | Moon |
| 2004/0220702 A1 | 11/2004 | Matsubara et al. |
| 2004/0220869 A1 | 11/2004 | Perera |
| 2004/0225648 A1 | 11/2004 | Ransom et al. |
| 2004/0225649 A1 | 11/2004 | Yeo et al. |
| 2004/0246643 A1 | 12/2004 | Chen |
| 2004/0249775 A1 | 12/2004 | Chen |
| 2004/0257858 A1 | 12/2004 | Mansingh et al. |
| 2004/0260430 A1 | 12/2004 | Mansingh et al. |
| 2004/0260489 A1 | 12/2004 | Mansingh et al. |
| 2004/0267466 A1 | 12/2004 | Enis et al. |
| 2005/0033481 A1 | 2/2005 | Budhraja et al. |
| 2005/0034023 A1 | 2/2005 | Maturana et al. |
| 2005/0039787 A1 | 2/2005 | Bing |
| 2005/0049757 A1 | 3/2005 | Funakura et al. |
| 2005/0055330 A1 | 3/2005 | Britton et al. |
| 2005/0071124 A1 | 3/2005 | Komatsu |
| 2005/0090995 A1* | 4/2005 | Sonderegger .............. H02J 3/00 702/57 |
| 2005/0096964 A1 | 5/2005 | Tsai |
| 2005/0165511 A1 | 7/2005 | Fairlie |
| 2005/0169743 A1 | 8/2005 | Hicks |
| 2005/0197742 A1 | 9/2005 | Scott et al. |
| 2005/0234600 A1 | 10/2005 | Boucher et al. |
| 2005/0240381 A1 | 10/2005 | Seiler et al. |
| 2005/0240539 A1 | 10/2005 | Olavson |
| 2006/0005738 A1 | 1/2006 | Kumar |
| 2006/0072271 A1 | 4/2006 | Jones et al. |
| 2006/0072828 A1 | 4/2006 | Silverbrook et al. |
| 2006/0085363 A1 | 4/2006 | Cheng et al. |
| 2006/0089805 A1 | 4/2006 | Enis et al. |
| 2006/0092177 A1 | 5/2006 | Blasko |
| 2006/0120282 A1 | 6/2006 | Carlson et al. |
| 2006/0156248 A1 | 7/2006 | Chaudhri et al. |
| 2006/0167591 A1 | 7/2006 | McNally |
| 2006/0174209 A1 | 8/2006 | Barros |
| 2006/0174211 A1 | 8/2006 | Hoellerer |
| 2006/0200308 A1 | 9/2006 | Arutunian |
| 2006/0206240 A1 | 9/2006 | Tsui |
| 2006/0238364 A1 | 10/2006 | Keefe |
| 2006/0238379 A1 | 10/2006 | Kimchi et al. |
| 2006/0259199 A1 | 11/2006 | Gjerde et al. |
| 2006/0276938 A1 | 12/2006 | Miller |
| 2007/0005192 A1 | 1/2007 | Schoettle et al. |
| 2007/0083821 A1 | 4/2007 | Garbow et al. |
| 2007/0097143 A1 | 5/2007 | Ii et al. |
| 2007/0143046 A1 | 6/2007 | Budike |
| 2007/0156291 A1 | 7/2007 | Curt et al. |
| 2007/0165050 A1 | 7/2007 | Baar |
| 2007/0203860 A1 | 8/2007 | Golden et al. |
| 2007/0213956 A1 | 9/2007 | Nasle et al. |
| 2007/0236507 A1 | 10/2007 | Tigges |
| 2007/0244604 A1 | 10/2007 | McNally |
| 2007/0266332 A1 | 11/2007 | Jubinski |
| 2007/0276547 A1 | 11/2007 | Miller |
| 2007/0282495 A1 | 12/2007 | Kempton et al. |
| 2007/0285079 A1 | 12/2007 | Nasle |
| 2008/0077368 A1 | 3/2008 | Nasle |
| 2008/0133313 A1 | 6/2008 | Bateni et al. |
| 2008/0154693 A1 | 6/2008 | Bateni et al. |
| 2008/0167756 A1 | 7/2008 | Golden et al. |
| 2008/0172279 A1 | 7/2008 | Enis et al. |
| 2008/0174564 A1 | 7/2008 | Kim et al. |
| 2008/0189656 A1 | 8/2008 | Abanami et al. |
| 2008/0195255 A1 | 8/2008 | Lutze et al. |
| 2008/0215263 A1 | 9/2008 | Flohr |
| 2008/0249665 A1 | 10/2008 | Emery et al. |
| 2008/0263469 A1 | 10/2008 | Nasle et al. |
| 2008/0272934 A1 | 11/2008 | Wang et al. |
| 2008/0278311 A1 | 11/2008 | Grange |
| 2008/0300698 A1 | 12/2008 | Havekost et al. |
| 2008/0301565 A1 | 12/2008 | Abhyanker |
| 2009/0047564 A1 | 2/2009 | Touvard |
| 2009/0048716 A1 | 2/2009 | Marhoefer |
| 2009/0048718 A1 | 2/2009 | Richard et al. |
| 2009/0062969 A1 | 3/2009 | Chandra et al. |
| 2009/0073191 A1 | 3/2009 | Smith et al. |
| 2009/0075663 A1 | 3/2009 | Wilson |
| 2009/0093916 A1 | 4/2009 | Parsonnet et al. |
| 2009/0118873 A1 | 5/2009 | Cheng et al. |
| 2009/0121923 A1 | 5/2009 | Mainds et al. |
| 2009/0187284 A1 | 7/2009 | Kreiss et al. |
| 2009/0192655 A1 | 7/2009 | Ichikawa et al. |
| 2009/0216387 A1 | 8/2009 | Klein |
| 2009/0234511 A1 | 9/2009 | Ouchi et al. |
| 2009/0240431 A1 | 9/2009 | Chau et al. |
| 2009/0254396 A1 | 10/2009 | Metcalfe |
| 2009/0265568 A1 | 10/2009 | Jackson |
| 2009/0284542 A1 | 11/2009 | Baar et al. |
| 2009/0292402 A1 | 11/2009 | Cruickshank, III |
| 2009/0299537 A1 | 12/2009 | Rea et al. |
| 2009/0319090 A1 | 12/2009 | Dillon et al. |
| 2010/0076835 A1 | 3/2010 | Silverman |
| 2010/0100250 A1 | 4/2010 | Budhraja et al. |
| 2010/0179704 A1 | 7/2010 | Ozog |
| 2010/0191385 A1 | 7/2010 | Goodnow et al. |
| 2010/0191489 A1 | 7/2010 | Zolot |
| 2010/0198421 A1 | 8/2010 | Fahimi et al. |
| 2010/0217642 A1 | 8/2010 | Crubtree et al. |
| 2010/0217651 A1 | 8/2010 | Crubtree et al. |
| 2010/0222935 A1 | 9/2010 | Forbes et al. |
| 2010/0223577 A1 | 9/2010 | Bennett et al. |
| 2010/0247067 A1 | 9/2010 | Gratton |
| 2010/0253142 A1 | 10/2010 | Votoupal et al. |
| 2010/0274402 A1 | 10/2010 | Shaffer |
| 2010/0281405 A1 | 11/2010 | Whattam |
| 2010/0282460 A1 | 11/2010 | Stone et al. |
| 2010/0292856 A1 | 11/2010 | Fujita |
| 2010/0298998 A1 | 11/2010 | Hamilton, II et al. |
| 2011/0029141 A1 | 2/2011 | Sun et al. |
| 2011/0029142 A1 | 2/2011 | Sun et al. |
| 2011/0029147 A1 | 2/2011 | Sun et al. |
| 2011/0035071 A1 | 2/2011 | Sun et al. |
| 2011/0046801 A1 | 2/2011 | Imes et al. |

(56) References Cited

U.S. PATENT DOCUMENTS

| | | |
|---|---|---|
| 2011/0066258 A1 | 3/2011 | Torzhkov et al. |
| 2011/0071690 A1 | 3/2011 | Sun et al. |
| 2011/0071692 A1 | 3/2011 | D'Amato et al. |
| 2011/0093123 A1 | 4/2011 | Alexanian |
| 2011/0101779 A1 | 5/2011 | Patel et al. |
| 2011/0173109 A1 | 7/2011 | Synesiou et al. |
| 2011/0184604 A1 | 7/2011 | Franke et al. |
| 2011/0202467 A1 | 8/2011 | Hilber et al. |
| 2011/0231028 A1 | 9/2011 | Ozog |
| 2011/0282508 A1 | 11/2011 | Goutard et al. |
| 2011/0282982 A1 | 11/2011 | Jain |
| 2011/0296865 A1 | 12/2011 | Yuan et al. |
| 2011/0307109 A1 | 12/2011 | Sri-Jayantha |
| 2012/0136775 A1 | 5/2012 | Cotton |
| 2013/0024710 A1 | 1/2013 | Jackson |
| 2015/0255983 A1 | 9/2015 | Sum et al. |
| 2016/0041575 A1 | 2/2016 | Tadano |
| 2017/0359418 A1 | 12/2017 | Sustaeta et al. |

OTHER PUBLICATIONS

European Office Action dated Aug. 28, 2017 for European Application No. 08782095.7, 3 pages.
Office Action dated Dec. 29, 2016 for U.S. Appl. No. 14/231,387, 38 pages.
Notice of Allowance dated Mar. 17, 2017 for U.S. Appl. No. 14/231,387, 26 pages.
Office Action dated Feb. 17, 2012 for U.S. Appl. No. 12/830,004, 32 pages.
Office Action dated Aug. 2, 2012 for U.S. Appl. No. 12/830,004, 32 pages.
Office Action dated Jun. 25, 2012 for U.S. Appl. No. 12/830,019, 42 pages.
Office Action dated Dec. 3, 2012 for U.S. Appl. No. 12/830,019, 35 pages.
Office Action dated Nov. 20, 2014 for U.S. Appl. No. 12/830,049, 14 pages.
Office Action dated Sep. 10, 2015 for U.S. Appl. No. 12/830,004, 33 pages.
Final Office Action dated Dec. 8, 2014 for U.S. Appl. No. 12/830,004, 43 pages.
Office Action dated Jun. 6, 2014 for U.S. Appl. No. 12/830,004, 58 pages.
Office Action dated Jul. 14, 2014 for U.S. Appl. No. 12/830,004, 38 pages.
Office Action dated Sep. 4, 2014 for U.S. Appl. No. 12/830,019, 6 pages.
Office Action dated Jan. 28, 2015 for U.S. Appl. No. 12/830,019, 9 pages.
Final Office Action dated Dec. 17, 2015 for U.S. Appl. No. 12/830,004, 55 pages.
Office Action dated Mar. 7, 2016 for U.S. Appl. No. 12/830,011, 52 pages.
Office Action dated Sep. 13, 2016 for U.S. Appl. No. 12/830,004, 39 pages.
Office Action dated Jan. 9, 2017 for U.S. Appl. No. 14/601,838, 69 pages.
K. W. Cheung and R. Rios-Zalapa, "Smart dispatch for large grid operations with integrated renewable resources," ISGT 2011,Hilton Anaheim, CA, 2011, pp. 1-7.
K. Cheung, Xing Wang, But-Chung Chiu, Ying Xiao and R. Rios-Zalapa, "Generation dispatch in a smart grid environment," 2010 Innovative Smart Grid Technologies (ISGT), Gaithersburg, MD, 2010, pp. 1-6.
Non-Final Office Action received for U.S. Appl. No. 12/830,038 dated Oct. 29, 2012, 70 pages.
Final Office Action received for U.S. Appl. No. 12/830,038 dated Mar. 1, 2013, 28 pages.
Non-Final Office Action received for U.S. Appl. No. 12/830,038 dated Sep. 5, 2013, 362 pages.

Signet al., "Load Modelling for Real Time Monitoring of Power Systems", 1977, IEEE, pp. 1908-1914.
Tabari et al., "Maintenance Schedule Aided by a Comprehensive Mathematical Model in Competive Environments", 2004, IEEE,pp. 1774-1779.
Wiedman,T.E., "A Transmission Owner's Perspective on the Future Roles and Responsibilities of Transmission ExpansionPlanning", 2002, IEEE,pp. 1054-1056.
Yadav et al., "Autocorrelation Based Weighing Strategy for Short-Term Load Forecasting with the Self-Oranizing Map", 2010,IEEE, pp. 186-192.
Hobbs et al., "Analysis of the Value for Unit Commitment of Improved Load Forecasts", 1999, IEEE,pp. 1342-1348.
Liu et al., "Combining Multi Wavelet and Multi NN for Power Systems Load Forecasting" Institute of Electrification & Automation,Southwest Jiaotong University, Chengdu, 2008, pp. 666-673.
Lazarevic-A., "Autonomous Grid Scheduling Using Probabilistic Job Runtine Forecasting", PhD dissertation, 2008, 245 pages.
Final Office Action received for U.S. Appl. No. 12/830,038 dated Mar. 13, 2014, 75 pages.
Barton et al., "Energy Storage and Its Use With Intermittent Renewable Energy", IEEE, 2004, pp. 441-448.
Kobayashi et al., "Electrical Load Forecasting using Scatter Search Based Weighted Average Weather Conditions", IEEE, 2006,International Joint Conference on Neural Networks, Jul. 16-21, 2006, pp. 3754-3759.
Mu et al., "Short-term Load Forecasting Using Improved Similar Days Method", IEEE, Mar. 2010, pp. 28-31.
Non-Final Office Action received for U.S. Appl. No. 12/830,038 dated Jul. 18, 2014, 39 pages.
Non-Final Office Action received for U.S. Appl. No. 12/830,038 dated Nov. 10, 2014, 34 pages.
Non-Final Office Action received for U.S. Appl. No. 14/743,958 dated Aug. 7, 2017, 211 pages.
Final Office Action received for U.S. Appl. No. 14/743,958 dated Mar. 21, 2018, 13 pages.
Non-Final Office Action received for U.S. Appl. No. 15/011,844 dated Oct. 19, 2018, 67 pages.
Non-Final Office Action received for U.S. Appl. No. 15/659,770 dated Jul. 12, 2018, 95 pages.
Non-Final Office Action for U.S. Appl. No. 15/790,599 dated Jan. 14, 2019, 69 pages.
Final Office Action for U.S. Appl. No. 15/659,770 dated Nov. 23, 2018, 69 pages.
Non-Final Office Action for U.S. Appl. No. 15/822,291 dated Apr. 2, 2019, 68 pages.
Advisory Action for U.S. Appl. No. 15/659,770 dated Feb. 13, 2019, 60 pages.
Communication pursuant to Article 94(3) EPC received for European Application Serial No. 08796333.6 dated Oct. 22, 2012, 3 pages.
The extended European search report received for European Application Serial No. 08796333.6 dated Feb. 13, 2012, 5 pages.
The extended European search report received for European Application Serial No. 08796327.8 dated Apr. 23, 2012, 5 pages.
Communication pursuant to Article 94(3) EPC received for European Application Serial No. 08782095.7 dated Oct. 19, 2012, 4 pages.
Communication pursuant to Article 94(3) EPC received for European Application Serial No. 08796334.4 dated Oct. 22, 2012, 3 pages.
The extended European search report received for European Application Serial No. 08796334.4 dated Feb. 13, 2012, 5 pages.
Communication pursuant to Article 94(3) EPC received for European Application Serial No. 08782097.3 dated Oct. 19, 2012, 4 pages.
Communication pursuant to Article 94(3) EPC received for European Application Serial No. 08782097.3 dated May 22, 2018, 4 pages.
The extended European search report received for European Application Serial No. 08782097.3 dated Feb. 13, 2012, 6 pages.

(56) References Cited

OTHER PUBLICATIONS

Tomsovic, et al. Designing the Next Generation of Real-Time Control, Communication and Computations for Large Power Systems, Proceedings of the IEEE (Special Issue on Infrastructure Systems), 93(5), May 2005.
Overbye, et al., "Visualization of Power Systems and Components: Final Report." 2005. University of Illinois at Urbana-Champaign. Power Systems Engineering Research Center (PSERC) Publication 05-065.
Ray Klump, et al., "An advanced visualization platform for real-time power systems operations". Power Systems Computation Conference (PSCC), Sevilla, Spain, Jun. 2002, 8 pages.
Pathalawaththa, et al., "A power system CAD package for the workstation and personal computer environment." IEEE Transactions on Power Systems. vol. 6, No. 1, pp. 400-406, Feb. 1991.
CERTS Real-Time Voltage Monitoring and VAR Management System, California Energy Commission, Oct. 2003, P500-03-087F, 20 pages.
A.P. Sakis Meliopoulos, Power System Modeling, Analysis and Control, Georgia Institute of Technology, 2002.
Wu, et al., Power System Control Centers; Past, Present, and Future. Proceedings IEEE, 2005, vol. 93; NUMB 11, pp. 1890-1908.
Vilcahuaman, Volt/Var Control with Interactive Graphics Interface on Distribution Systems. Publication and date presently unknown. [Retreived Apr. 9, 2010]. Downloaded from the Internet: ,url.http://www.iansa.com.pe/volt_var_control.pdf.
Rasmussen, "Increasing data center efficiency by using improved high density power distribution", American Power Conversion, pp. 1-10, (2008).
Techsmith. "Snagit", published online at [http://www.techsmith.com/snagit-featue.html], retrieved on Oct. 28, 2011, 2 pages.
Wikipedia. "Snagit", published online at [http://en.wikipedia.org/wiki/snagit] retrieved on Oct. 28, 2011, 3 pages.
International Search Report dated Oct. 9, 2008 for International Patent Application No. PCT/US08/70526, 3 pages.
International Search Report dated Oct. 9, 2008 for International Patent Application No. PCT/US08/70537, 3 pages.
International Search Report dated Oct. 8, 2008 for International Patent Application No. PCT/US08/70544, 3 pages.
International Search Report dated Oct. 9, 2008 for International Patent Application No. PCT/US08/70547, 3 pages.
International Search Report dated Oct. 10, 2008 for International Patent Application No. PCT/US08/70551, 3 pages.
International Search Report dated Oct. 10, 2008 for International Patent Application No. PCT/US08/70552, 3 pages.
Examination Report dated May 2, 2013 for European Patent Application No. 08796334.4-1806, 3 pages.
Examination Report dated May 2, 2013 for European Patent Application No. 08782095.7-1806, 3 pages.
Examination Report dated Mar. 15, 2013 for European Patent Application No. 08796327.8-1806, 3 pages.
Examination Report dated May 2, 2013 for European Patent Application No. 08782097.3-1806, 3 pages.
Examination Report dated May 2, 2013 for European Patent Application No. 08796333.6-1806, 62 pages.
Extended European Search Report dated Oct. 2, 2013 for European Patent Application 08782090.8-1806, 6 pages.
Examination Report dated Sep. 26, 2013 for European Patent Application No. 08 782 095.7-1806, 3 pages.
Office Action dated Jul. 17, 2013 for U.S. Appl. No. 12/139,159, 28 pages.
European Office Action dated Jun. 11, 2014 for European Application Serial No. 08796334.4, 3 pages.
European Office Action dated Jun. 6, 2014 for European Application Serial No. 08782090.8, 4 pages.
European Office Action dated Jul. 8, 2014 for European Application Serial No. 08782097.3, 4 pages.
Non-Final Office Action dated Mar. 13, 2015 for U.S. Appl. No. 13/590,321, 51 pages.
Final Office Action dated Oct. 15, 2015 for U.S. Appl. No. 13/590,321, 31 pages.
Non-Final Office Action dated Aug. 13, 2015 for U.S. Appl. No. 13/658,489, 46 pages.
European Office Action dated Aug. 9, 2015 for European Application Serial No. 08782095.7, 4 pages.
European Office Action dated Aug. 24, 2015 for European Application Serial No. 08782097.3, 4 pages.
European Office Action dated Aug. 21, 2015 for European Application Serial No. 08796334.4, 3 pages.
European Office Action dated Aug. 21, 2015 for European Application Serial No. 08782090.8, 4 pages.
https://www.techsmith.com/snagit.html, 7 pages (Last accessed: Apr. 18, 2016).
https://en.wikipedia.org/wiki/Snagit, 3 pages (Last accessed: Apr. 18, 2016).
Non-Final Office Action dated Jun. 21, 2016 for U.S. Appl. No. 14/231,387, 66 pages.
European Office Action dated Aug. 4, 2016 for European Application Serial No. 08782095.7, 3 pages.
European Office Action dated Aug. 4, 2016 for European Application Serial No. 08782097.3, 3 pages.
Office Action for U.S. Appl. No. 15/091,552 dated Apr. 6, 2018, 57 pages.
Office Action for U.S. Appl. No. 15/091,552 dated Aug. 28, 2018, 17 pages.
Non-Final Office Action received for U.S. Appl. No. 12/139,111 dated Jul. 23, 2009, 19 pages.
Final Office Action received for U.S. Appl. No. 12/139,111 dated Mar. 24, 2010, 19 pages.
Non-Final Office Action received for U.S. Appl. No. 12/139,111 dated Oct. 29, 2010, 21 pages.
Final Office Action received for U.S. Appl. No. 12/139,111 dated Jul. 8, 2011, 22 pages.
Non-Final Office Action received for U.S. Appl. No. 12/139,159 dated Jun. 23, 2011, 41 pages.
Final Office Action received for U.S. Appl. No. 12/139,159 dated Nov. 30, 2011, 28 pages.
Non-Final Office Action received for U.S. Appl. No. 12/139,194 dated Jul. 20, 2011, 27 pages.
Final Office Action received for U.S. Appl. No. 12/139,194 dated Nov. 7, 2011, 25 pages.
Non-Final Office Action received for U.S. Appl. No. 12/139,167 dated Nov. 23, 2011, 27 pages.
Final Office Action received for U.S. Appl. No. 12/139,167 dated Jan. 25, 2012, 18 pages.
Non-Final Office Action received for U.S. Appl. No. 12/139,167 dated May 29, 2012, 15 pages.
Non-Final Office Action received for U.S. Appl. No. 15/091,552 dated Jan. 10, 2019, 20 pages.
Non-Final Office Action received for U.S. Appl. No. 12/139,189 dated Apr. 20, 2010, 39 pages.
Final Office Action received for U.S. Appl. No. 12/139,189 dated Jan. 4, 2011, 36 pages.
Non-Final Office Action received for U.S. Appl. No. 12/139,118 dated Mar. 7, 2011, 20 pages.
Final Office Action received for U.S. Appl. No. 12/139,118 dated Dec. 20, 2011, 25 pages.
Non-Final Office Action received for U.S. Appl. No. 12/830,028 dated Apr. 20, 2012, 23 pages.
Final Office Action received for U.S. Appl. No. 12/830,028 dated May 10, 2012, 19 pages.
Non-Final Office Action received for U.S. Appl. No. 12/830,028 dated Feb. 27, 2013, 25 pages.
Non-Final Office Action received for U.S. Appl. No. 14/012,853 dated May 19, 2014, 55 pages.
Final Office Action received for U.S. Appl. No. 14/012,853 dated Oct. 10, 2014, 43 pages.
Non-Final Office Action received for U.S. Appl. No. 14/012,853 dated Feb. 23, 2015, 18 pages.
Non-Final Office Action received for U.S. Appl. No. 14/012,853 dated Sep. 21, 2015, 46 pages.

(56) References Cited

OTHER PUBLICATIONS

Final Office Action received for U.S. Appl. No. 14/012,853 dated Aug. 31, 2016, 47 pages.
Non-Final Office Action received for U.S. Appl. No. 14/012,853 dated Jan. 9, 2017, 38 pages.
Notice of Allowance received for U.S. Appl. No. 14/012,853 dated Aug. 15, 2017, 95 pages.
Office Action dated Sep. 11, 2013 for U.S. Appl. No. 12/830,011, 42 pages.
Office Action dated Oct. 7, 2011 for U.S. Appl. No. 12/830,023, 22 pages.
Office Action dated Feb. 9, 2012 for U.S. Appl. No. 12/830,023, 19 pages.
Office Action dated Sep. 27, 2013 for U.S. Appl. No. 12/830,023, 38 pages.
Office Action dated Apr. 6, 2012 for U.S. Appl. No. 12/380,042, 26 pages.
Office Action dated May 11, 2012 for U.S. Appl. No. 12/380,042, 16 pages.
Office Action dated Dec. 14, 2012 for U.S. Appl. No. 12/380,042, 20 pages.
Office Action dated Apr. 8, 2013 for U.S. Appl. No. 12/380,042, 19 pages.
Office Action dated Feb. 16, 2012 for U.S. Appl. No. 12/830,011, 33 pages.
Office Action dated Mar. 6, 2014 for U.S. Appl. No. 12/830,023, 37 pages.
Office Action dated Mar. 7, 2014 for U.S. Appl. No. 12/830,042, 26 pages.
Office Action dated May 15, 2014 for U.S. Appl. No. 12/830,023, 41 pages.
Office Action dated Aug. 5, 2014 for U.S. Appl. No. 12/830,042, 29 pages.
Office Action dated Nov. 20, 2014 for U.S. Appl. No. 12/830,042, 12 pages.
Office Action dated Mar. 25, 2015 for U.S. Appl. No. 12/830,042, 14 pages.
Office Action dated Feb. 26, 2015 for U.S. Appl. No. 12/830,011, 45 pages.
Final Office Action dated Jul. 1, 2015 for U.S. Appl. No. 12/830,011, 48 pages.
Office Action dated Mar. 16, 2012 for U.S. Appl. No. 12/830,049, 23 pages.
Office Action dated Dec. 20, 2012 for U.S. Appl. No. 12/830,049, 27 pages.
Office Action dated Nov. 18, 2013 for U.S. Appl. No. 12/830,049, 16 pages.
Office Action dated Mar. 21, 2014 for U.S. Appl. No. 12/830,049, 19 pages.
Office Action dated Aug. 5, 2014 for U.S. Appl. No. 12/830,049, 19 pages.

* cited by examiner

FIG. 21

METHODS FOR ASSESSING RELIABILITY OF A UTILITY COMPANY'S POWER SYSTEM

CROSS-REFERENCE TO RELATED APPLICATION

This application is a continuation of, and claims priority to each of, U.S. patent application Ser. No. 13/590,321 filed Aug. 21, 2012, and entitled "METHODS FOR ASSESSING RELIABILITY OF A UTILITY COMPANY'S POWER SYSTEM", which is a continuation of U.S. patent application Ser. No. 12/139,194 filed Jun. 13, 2008, and entitled "METHODS FOR ASSESSING RELIABILITY OF A UTILITY COMPANY'S POWER SYSTEM", now issued as U.S. Pat. No. 8,321,804, which claims the benefit of U.S. Provisional Patent Application No. Ser. No. 60/952,021 filed Jul. 26, 2007, and entitled "METHODS FOR ASSESSING RELIABILITY OF A UTILITY COMPANY'S POWER SYSTEM". The entireties of the foregoing applications are hereby incorporated by reference herein.

BACKGROUND OF THE INVENTION

Field of the Invention

This invention relates generally systems and methods that improve energy management, and more particularly to systems and methods for the utility market.

Description of the Related Art

The modern electric power grid begins as the primary circuit leaves the generating sub-station, is transported via transmission line, distributed via distribution feeders, and ends as the secondary service enters the customers meter socket. This invention relates to the management of the transmission system, from a control center, which purpose is to maintain ail equipment within operating limits and to ensure the provision of electricity at a reliability rate greater than 99.999%.

To manage the grid, electric utilities rely on Energy Management Systems (EMS) which are mission critical information system that collect data from the field and can control protection devices from the control center via a Supervisory Control and Data Acquisition system (SCADA).

The EMS are more sophisticated today with advanced algorithms and increasing volume of data coming from smarter grids that are equipped with intelligent electronic devices (IED).

However, intelligent grids and sophisticate power system algorithms that process field data will not suffice to prevent human errors in control centers. Operators continuously train to adapt to new system conditions and react to emergency situations. This general aptitude to master complex information and make correct decisions is referred to as "situation awareness".

Catastrophic failures of a power system are relatively uncommon, but they are spectacular when they happen. Twenty-five million people in the northeastern United States lost electric power for 12 hours in 1965. Another blackout shut down New York City for several days in 1977. And in 2003, the largest power failure in North American history left 40 million people in an area in the United States stretching from Massachusetts, Connecticut, New York and New Jersey west to Ohio and Michigan, and 10 million people in eastern Canada, without power. The lack of adequate situational awareness at multiple levels was one of the root causes of the Aug. 14, 2003 massive power blackout in North America.

Designing tools for adequate Situation Awareness (SA) includes that: the following factors be kept in mind; so-called "enemies of situational awareness"; attention tunneling, requisite memory trap; data overload; misplaced salience; complexity creep, errant, mental models, out-of-the-loop syndrome; workload, anxiety, fatigue, and other stress factors.

There is a need for methods that assess reliability of power systems of a utility company. There is a further need for methods that assess reliability of power systems of a utility company with violation markers that are displayed on a main overview display.

SUMMARY OF THE INVENTION

Accordingly, an object of the present invention is to provide methods for assessing reliability of power systems of a utility company.

Another object of the present invention is to provide methods for assessing reliability of power systems of a utility company with viola Don markers that are displayed on a main overview display.

A further object of the present invention is to provide methods for assessing reliability of power systems of a utility company with violation markers and showing only those violations associated for a selected violated element on a monitored elements tab.

Yet another object of the present invention is to provide methods for assessing reliability of power systems of a utility company with violation markers and showing vital data related to violations selected on an overview display.

These and other objects of the present invention are achieved in a method of assessing reliability or a power system of a utility company. At least one main overview display is obtained. Violation markers are displayed on the one main overview display. A monitored elements tab is updated with a list of monitored elements.

DESCRIPTION OF THE DRAWINGS

FIG. 21 is associated with the FIG. 14 flow chart and shows a Contingency Tab in a control panel.

DETAILED DESCRIPTION OF THE
PREFERRED EMBODIMENT

Figure 13:
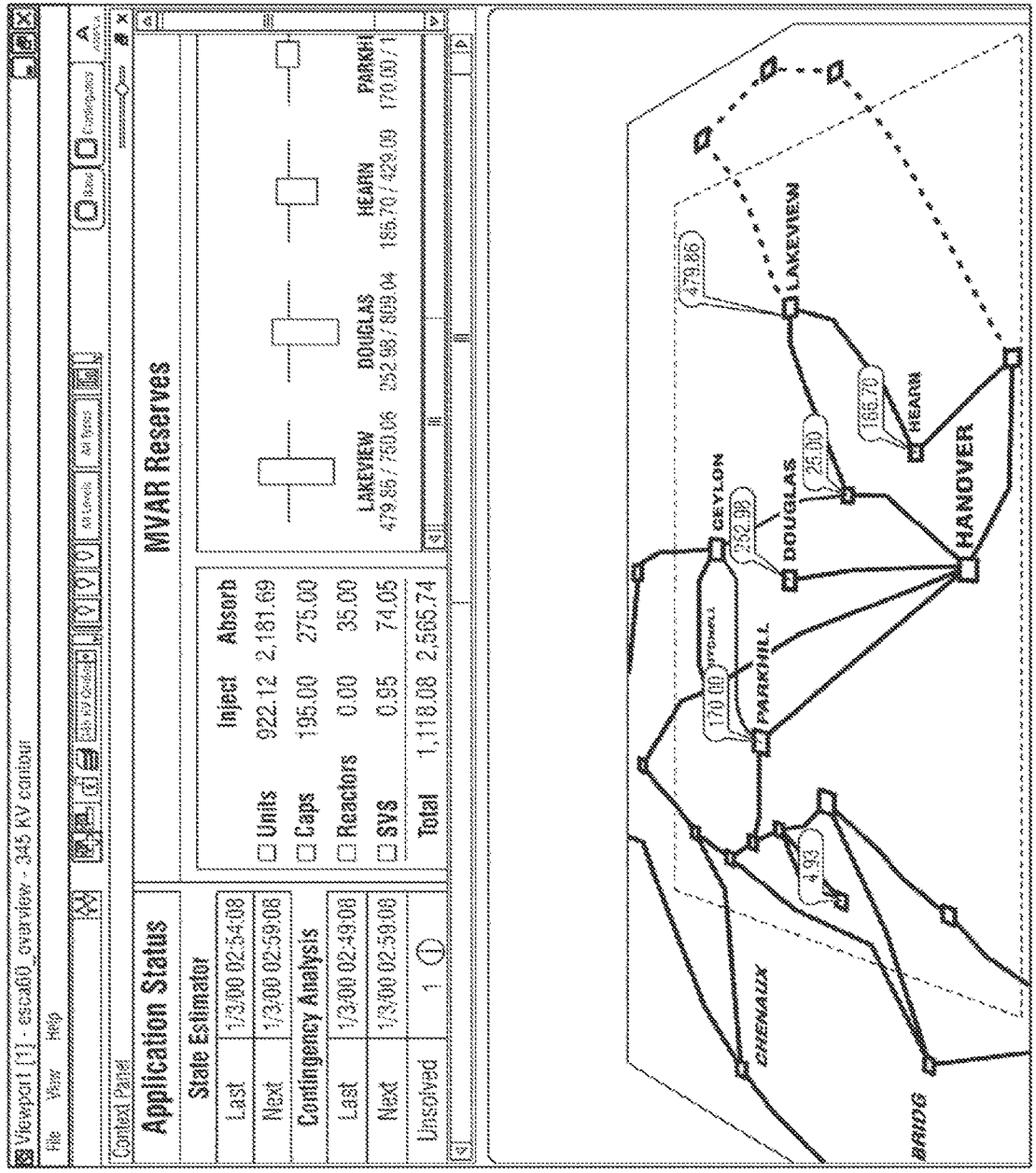
FIG. 13 illustrates a 3D view of the available MVARs using the positive and negative reactive reserves toolbar buttons, and can be associated with the FIG. 11 flow chart.

In various embodiments, the present invention provides a system and methods for enhance situational awareness for a control center of a utility company for improved energy management, to drill down on potential conditions that effect the distribution of power, and mitigates these potential conditions before catastrophic failures occur, provide a real time application of advanced graphics to display the current status of a power system of one or more utility companies, and the like. The present invention represents a new and improved way to design user interface, independently of the underlying application to display a 3D view of the available MVARs using the positive and negative reactive reserves toolbar buttons, as shown in FIG. 13.

The present invention represents a new and improved way to design user interface, independently or the underlying applications, algorithms, or databases. The main display is therefore targeted at a specific operator's task which may span several applications. Traditionally, a operator had to navigate among different user interfaces to achieve the same objective, albeit with much less productivity and slower reaction time.

The present invention is designed for mission critical systems that deal with large volume of data refreshed in real-time every seconds. These information systems cannot fail and must be available at a minimum 99.95% of the time.

The present invention is also designed to re-use most of the existing software applications already in place within the control center. Low cost of maintenance is achieved with automatic generation of displays and re-use of existing assets (software and hardware).

The systems and methods of the present invention can be used by utility companies that have a system including but not limited to power systems. The present invention can also be used by water management systems, petro-chemical systems, transportations systems, and the like. The power system is managed to bring energy to an end user and includes generation, transmission and distribution system. With the present invention, satellite maps can be utilized.

Figure 1:
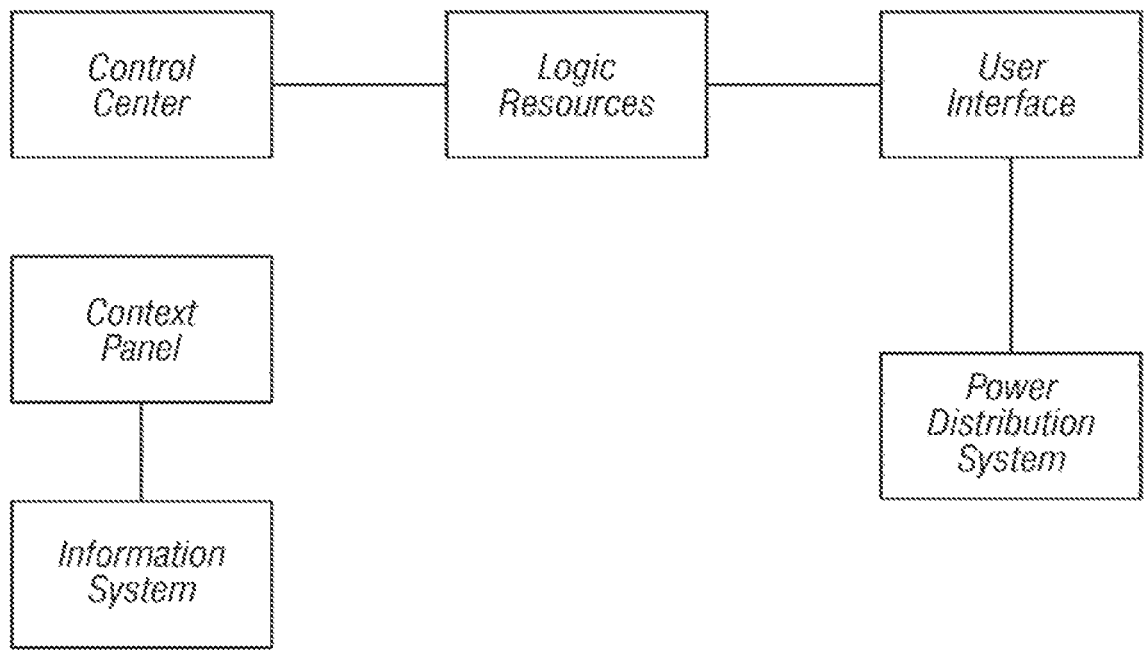
FIG. 1 is a block diagram illustrating one embodiment of an energy management system of the present invention that provides real time awareness of a potential energy management failure.

As illustrated in FIG. 1, one embodiment of the present invention has an energy management system that includes: a control center at a utility company; logic resources coupled to the power system that provide a real time notice of conditions which effect energy management of the utility company; and at least one user interface at the control center coupled to the logic resources. The user interfaces provide real time situation awareness of a potential energy management failure. The conditions can be one or more of energy, distribution, generation, transmission and energy market systems.

With the use of situation awareness of the present invention, a real time notice of conditions can be provided prior to an occurrence of, a catastrophic failure of power delivery, catastrophic power generation, catastrophic transmission and energy market systems and the like.

Situation awareness is perception and/or comprehension and is auditory and/or visual. Situational awareness, (i) improves energy management, facilitates drilling down on conditions that can effect energy management (ii) facilitates distribution of power, generation of power, transmission and energy market systems, (iii) mitigates the effects of conditions that can create failures in energy management and (iv) mitigates conditions that can create failures including best not limited to, delivery of power, generation of power, transmission and energy market systems.

The logic resources and the user interface are coupled to the power or distribution system of the utility company. The logic resources uses an overview of the majority of the utility system and drills down to more detailed views of the utility system.

The logic resources can be configured to re-use at least a portion of data and configurations from pre-existing software applications already in place in the control center. As a non-limiting example, the pre-existing software applications can include information of, system 1 lines, 1 line diagrams and/or asset information. The user interfaces provide a specific operator's task that can scan one or several utility company applications without navigating between different user interfaces of the control center.

The user interfaces include graphics that display one or more of, current status, mitigating factors and recommendations of the power system for one or more utility companies. The user interfaces can include advanced graphics that display a current: status of power generation, power generation, transmission and/or energy market systems. The user interfaces can be independent of an energy management application. In one embodiment, the user interfaces are automatically generated in response to data and configuration from pre-existing software or pre existing software applications and also uses its own. The user interfaces can be a model drivers overview, where the model driven overview combines coordinate system based on a geographical coordinate system including but not limited to GIS and the like.

One or more context panels can be provided with context data relative to a given situation facing the utility company. One or more information systems can also be provided that are refreshed in real-time. By way of non-limiting examples, the information system can be refreshed in a time period of from 1 second to 15 minutes, depending on the information and the situation.

Figure 2:
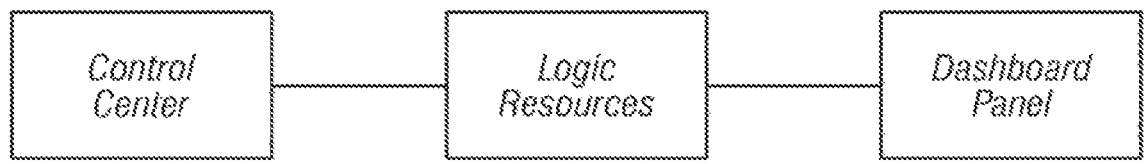
FIG. 2 is a block diagram illustrating one embodiment of an energy management system of the present invention which has situational dashboard panels.
Figure 3:
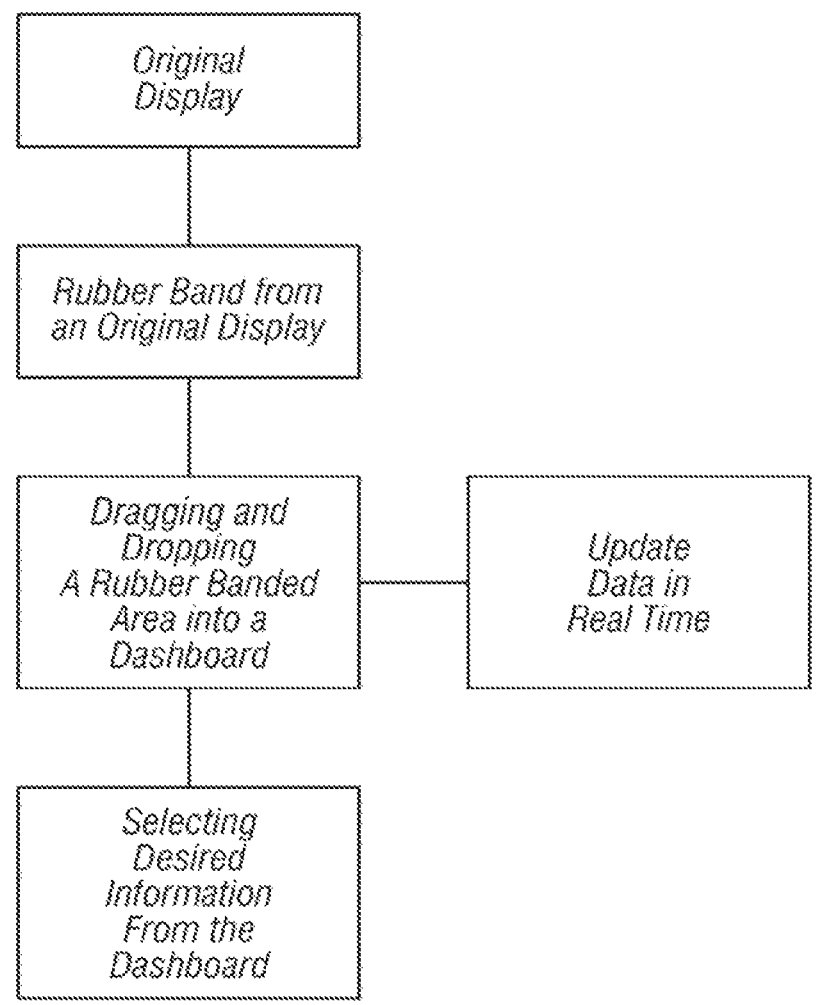
FIG. 3 is a flow chart illustrating one application of the FIG. 2 system.

In another embodiment of the present invention, illustrated in FIGS. 2 and 3, situational dynamic dashboards are created graphically and dynamically by operators. The situational dashboards can be built on-the-fly by combining subsets of, different displays, tabulars, one-lines, regional schematic and/or geographic overviews. The logic resources enable the operators to create their own dashboards from large geographical overviews, regional schematic displays and station one-line displays to assist operators in assessing a potentially compromising situation of the electric power system. Portions of the displays that are dropped onto a situational dashboard display can continue to be updated in real-time with live data.

As a non-limiting example, the potentially compromising situation can be, system violations of type branch, low voltage, high voltage and/or delta voltage, low or high voltage situation in a given area of the system, actual or potential system violations as a result of megawatts or megavars, and the like. The situational dashboards can be built on-the-fly by combining subsets of different displays, tabulars, one-lines, schematic, geographic overviews and the like, onto a dashboard area. The dashboards are saveable and reuseable, and are useful for identifying potentially compromising situations.

Figure 4:
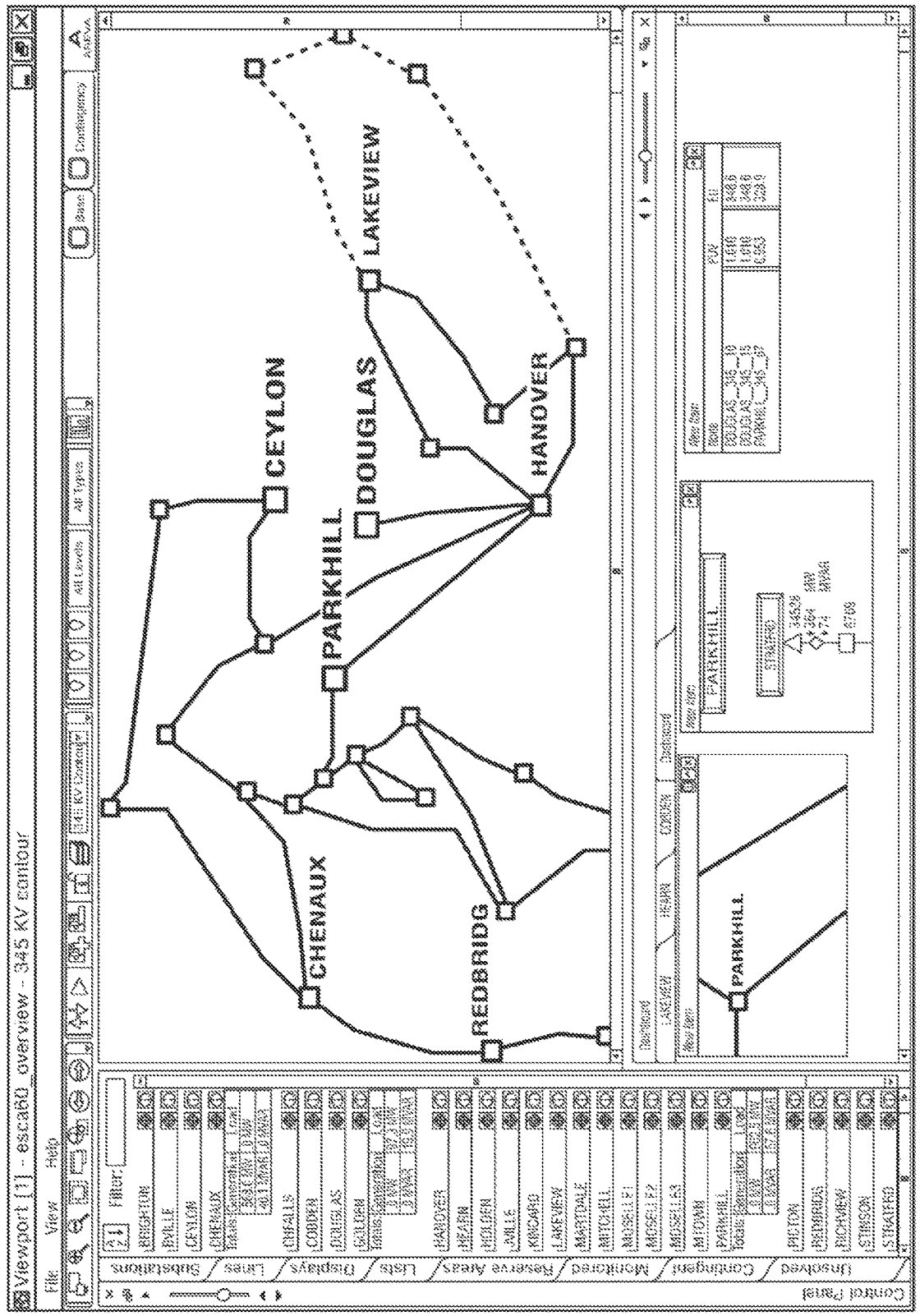
FIG. 4 illustrates one embodiment of a custom dashboard of the present invention sourced from three different displays.

FIG. 4 shows an example of a custom dashboard of the present invention sourced from three different displays. The operator selects the displays of interest. Snippets from the original displays are selected by rubber-banding, the selected area is cut (initiated by the operator "drag" operation) and then pasted, initiated by the operator "drop" operation, into the dashboard. The portions of the displays that are dropped onto a dashboard display continue to be updated in real-time. The result is a new dashboard display. Once created, a dashboard can be saved and recalled later just as any other display in the system and is refreshed with live data. The benefits of a dynamically created dashboard, which is created to specifically address a situation, is that it allows the operator to select only the information that is relevant to the situation which the operator is facing. This reduces the workload on the operator since the operator needs to focus only on what is relevant not a collection of displays which have vast amount of information on it which may not be relevant. The concept is simple: provide the operator with only the information he needs to do the job, not all the data that the system has and letting the operator constantly review the data and extract what is needed. One the dynamic dashboards are created they can be saved and re-used should the situation present itself, thus eliminating setup time.

In one embodiment, a fly-out or data tensing is provided. A fly-out is an effective, way to dynamically select, an area of a large overview display of the power system, or any display for that matter to direct the operator attention to where or what in the power system needs attention without loosing perspective of the whole power system which is being monitored and controlled.

The operator selects an area of the overview which it wishes to focus on by rubber-banding or lasso the area. The selected area of interest is cut and pasted into a fly-out. The fly-out cars can be moved and resized by dragging and resting the fly-out border to enhance the usability of the fly-out.

Figure 5:
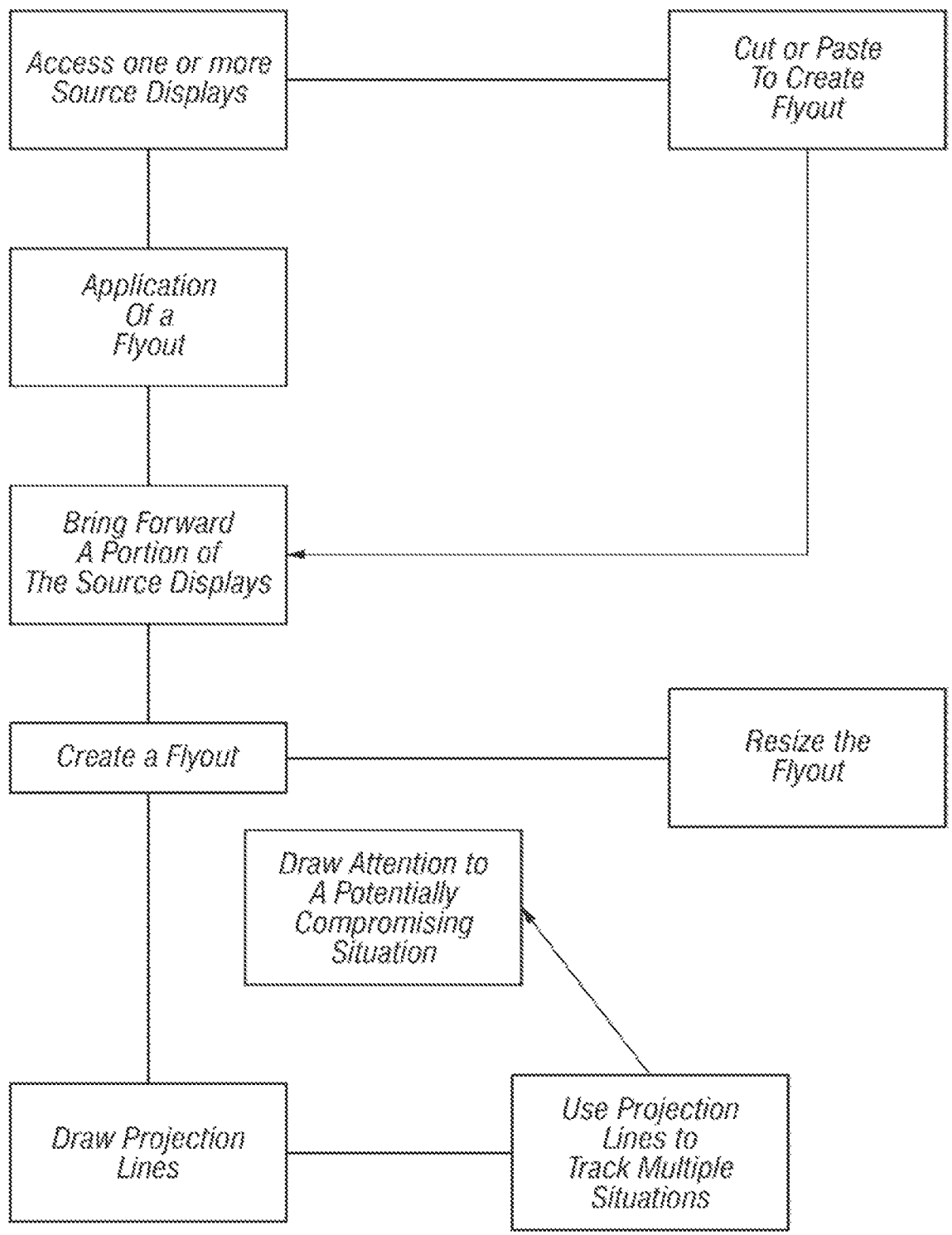
FIG. 5 is a flow chart illustrating one embodiment of a method of the present invention that assesses potentially compromising situations of a utility company.

As illustrated in FIG. 5, projection lines are can be drawn from the source display to the fly-out to maintain reference to toe source such that the operator always knows about the reference source of the fly-out. The projection lines can be used with multiple fly-outs, and can track multiple situations at the same time. This is important because an operator may be tracking multiple situations at the same time and must be aware of the context of each of the situations from the multiple situations. The projection lines provide the operator with an awareness of a context of situations and information about a reference source of the fly-out.

Figure 6:
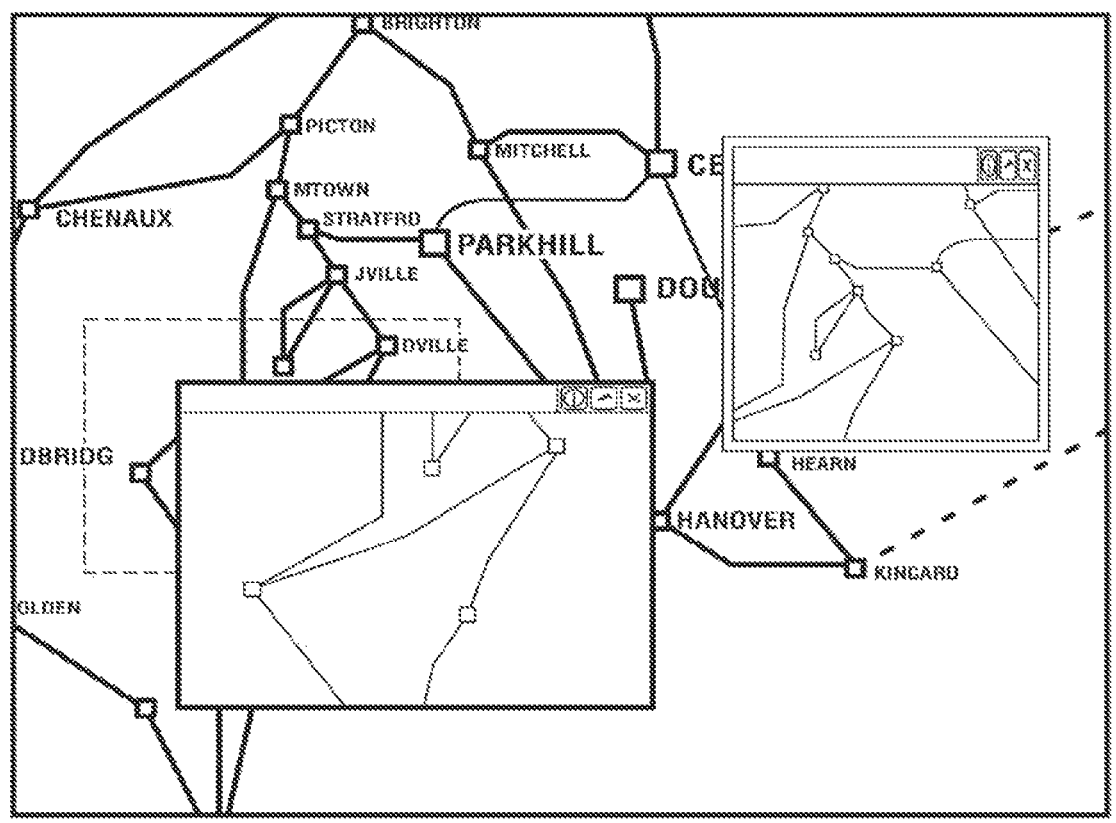
FIG. 6 illustrates one embodiment of a fly-out and a pod of the present invention.

A pod is a fly-out that has been un-pinned from the source display. Pods can be organized as additional windows to monitor specific information such as overload condition on a power line or a low voltage condition. FIG. 6 shows an example of a fly-out and a pod. Situation awareness principles can be utilized with the fly-out. The use of a fly-out allows an operator to generate informational displays without ever leaving the main overviews in order to accomplish a goal. This reinforces the goal of providing a use case based application. The operator is provided with only what it needs to the job and nothing else that can distract the operator from the task that the operator has been asked to do.

Figure 7:
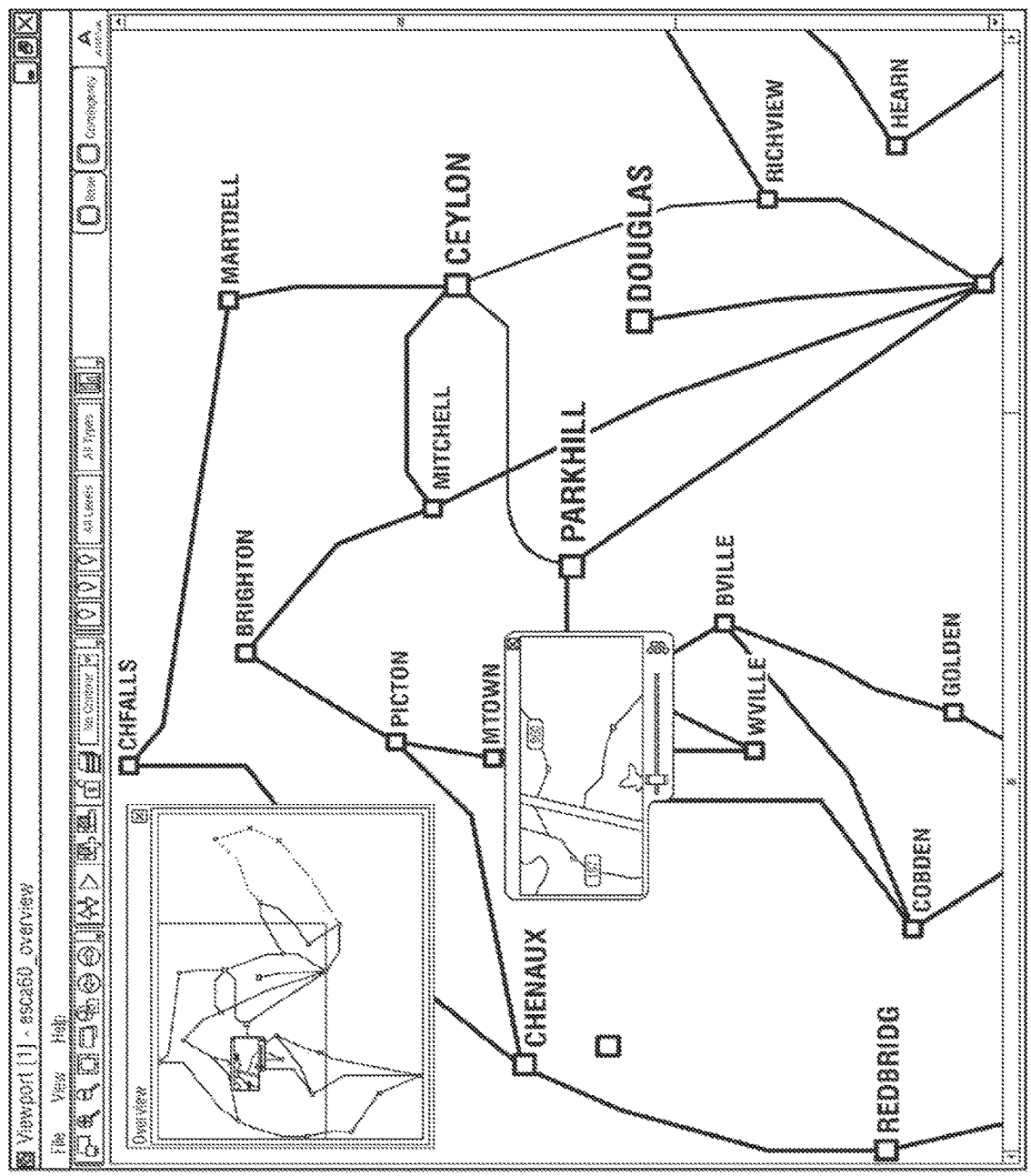
FIG. 7 illustrates one embodiment of a geographical overview with a background layer representing the aerial view of an area of the present invention.

FIG. 7 shows an example of a geographical overview with a background layer representing the aerial view of an area. Other types of operator selected backgrounds, such as jpegs and bitmaps, can be used. In one embodiment, geographic satellites are used to obtain the geographical overview. The operator can then pan and zoom, with different tiles coming up on the display.

Depending on the portion of the overview which is visible and the zoom level, the corresponding tile for the matching background is obtained from the site. Once it is obtained it is locally cached for performance improvement and displayed as the background layer. As the operator pans and the zooms the display new tiles are retrieved and displayed. For efficiency only, the required tiles are loaded into memory and visible in the background.

For optimal visibility depending on the display and control room lighting, the operator can adjust the opacity of the background image using a dialog which is available for invocation from an icon on the toolbar.

FIG. 7 also shows a navigation window and a magnifier in use.

Figure 8:
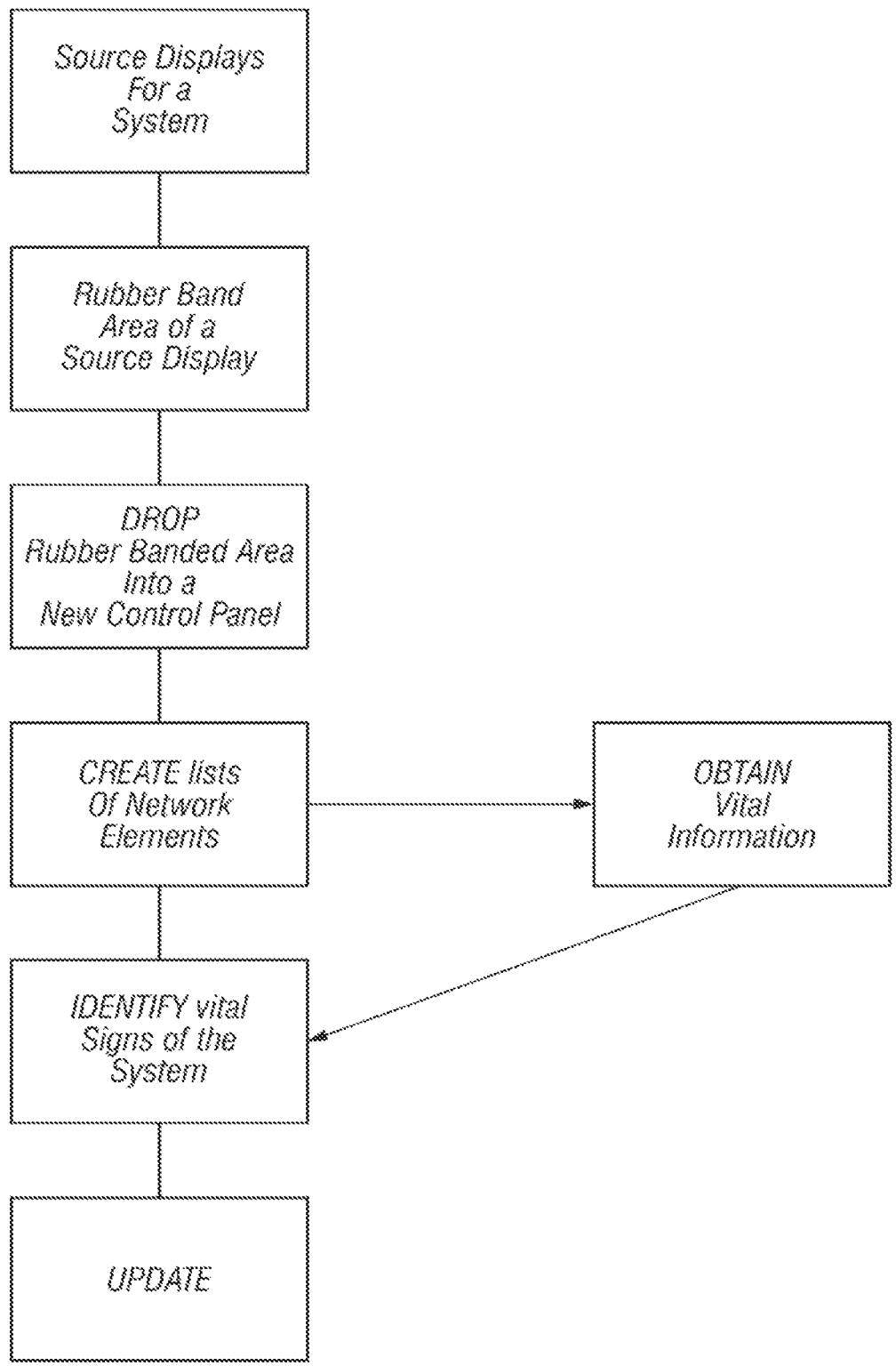
FIG. 8 is a flow chart illustrating one embodiment of a method of the present invention that creates dynamic lists from selected areas of a power system of a utility company using rubber-banding or lassoing.

In another embodiment of the present invention, illustrated in FIG. 8, a method is provided for creating dynamic lists from selected areas of the power system of the utility company. The energy management system is used to access one or more source displays of a site. One or more of the source displays are then rubber-banded or lassoed to create the selected areas from at least a portion of the source displays. Lists, which can be in tabular form, are dynamically created that display operator defined information for each network element type in a list of network elements from the selected areas that have been rubber-handed or lassoed. By way of illustration, and without limitation, the network elements can include one or more of, substations, lines, generators, capacitors, loads, transformers. Static Var Compensators and inductors, and the like. These lists are dynamically created for an operator selected area of the power system to quickly obtain vital signs for the system within the selected area.

In this embodiment the operator selects an area by rubber-banding or lassoing an area on the display using a device such as a mouse. All the network elements in the selected area of interest are identified.

The selected area is dragged into a new control panel tab and dropped into the tab. The action of "drag and drop" constitutes the creation of a new list of elements the operator wants to obtain vital information for vital signs. The new list of elements is created by identifying network elements within a perimeter of the selected area. As a non-limiting example, the network elements can be each station and each line within the boundary of the selected area.

The information, which makes up the vital signs, is operator definable. As a non-limiting example, the vital information can be one or more of, the state of the line, energization status of the lines, MegaWatt flows, MegaVar flows of the line, station load, station generation in MegaWatt and MegaVars and the like. The present invention takes care of retrieving, from the energy management system, the most recent data associated with this selection, and automatically keeps it up to date. Once the new list is created it can be saved and recalled for future use.

Figure 9:
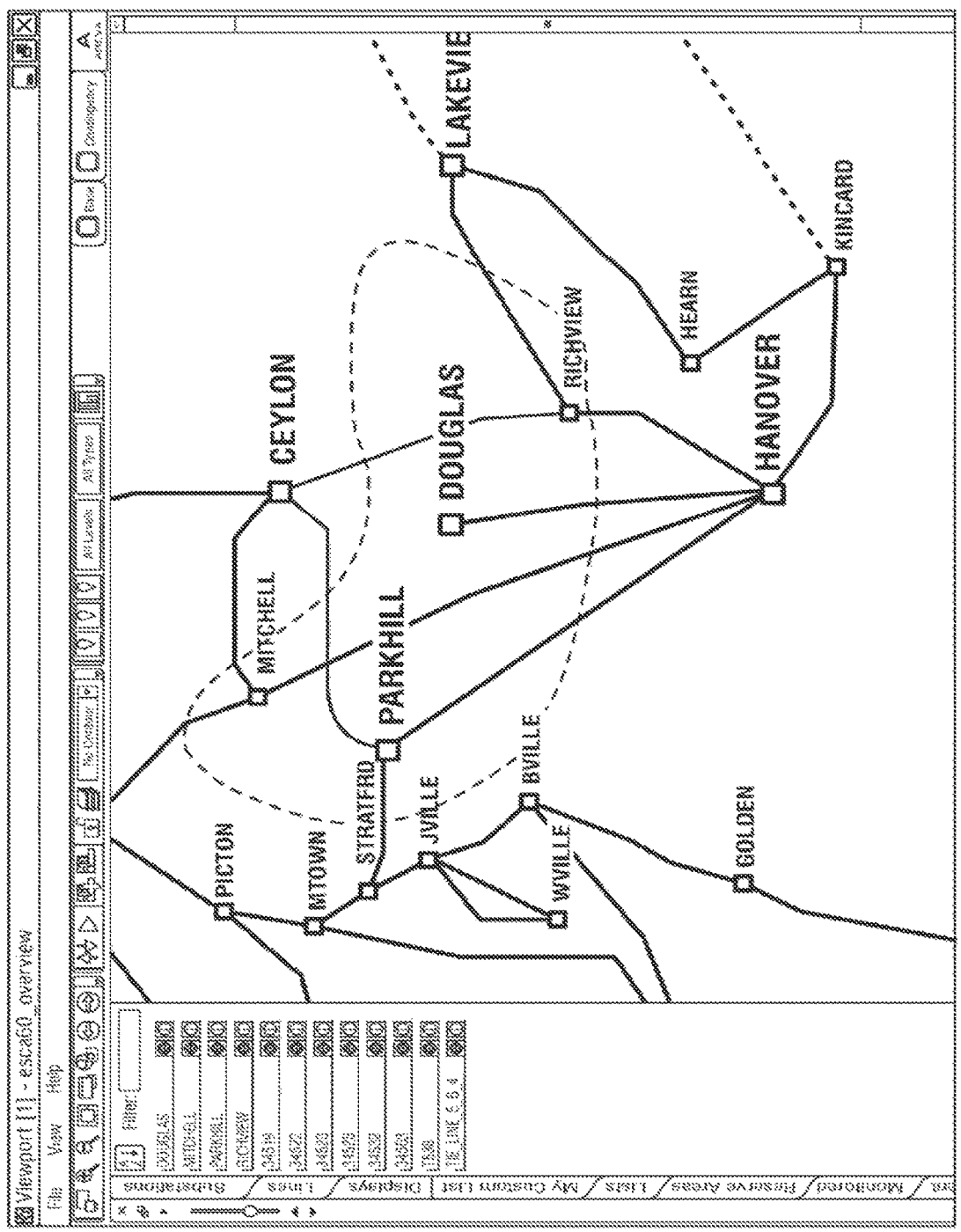
FIG. 9 illustrates one embodiment of area selection that can be used with the flow chart of FIG. 8.
Figures 10, 12:
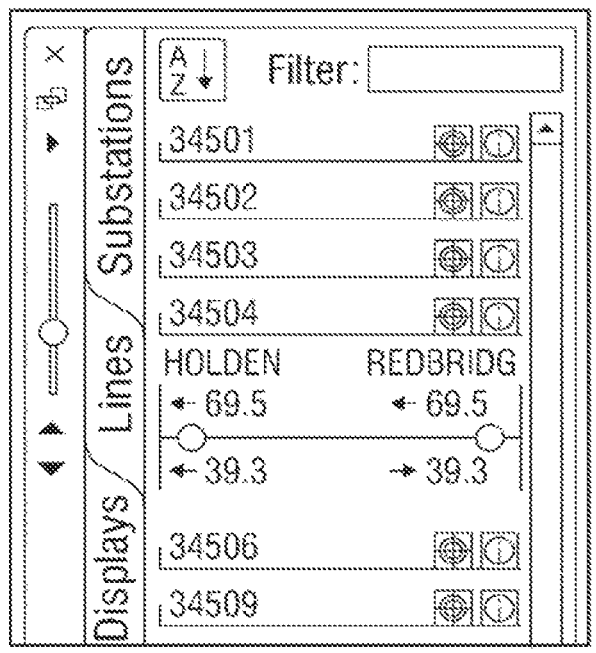
FIG. 10 illustrates one embodiment of vital signs for a selected element that can be utilized with the flow chart of FIG. 8.
FIG. 12 illustrates one embodiment of a MVAR Reserve dashboard that is automatically calculated based on the selected area and can be associated with the FIG. 11 flow chart.

An area selection is shown in FIG. 9. Vital signs for a selected element are shown in FIG. 10.

In one embodiment, the system of the present invention automatically populates the list and receives vital data for all of the elements in this list. The custom list can be given a name and saved for future use.

The control panel can have a special tab, called "Lists," which contains the names of all the custom-created areas. In one specific embodiment, the control panel has a MVAr Reserve tab that contains names of dynamically created MVar Reserve areas for a selected geographic representation of the power system.

Figure 11:
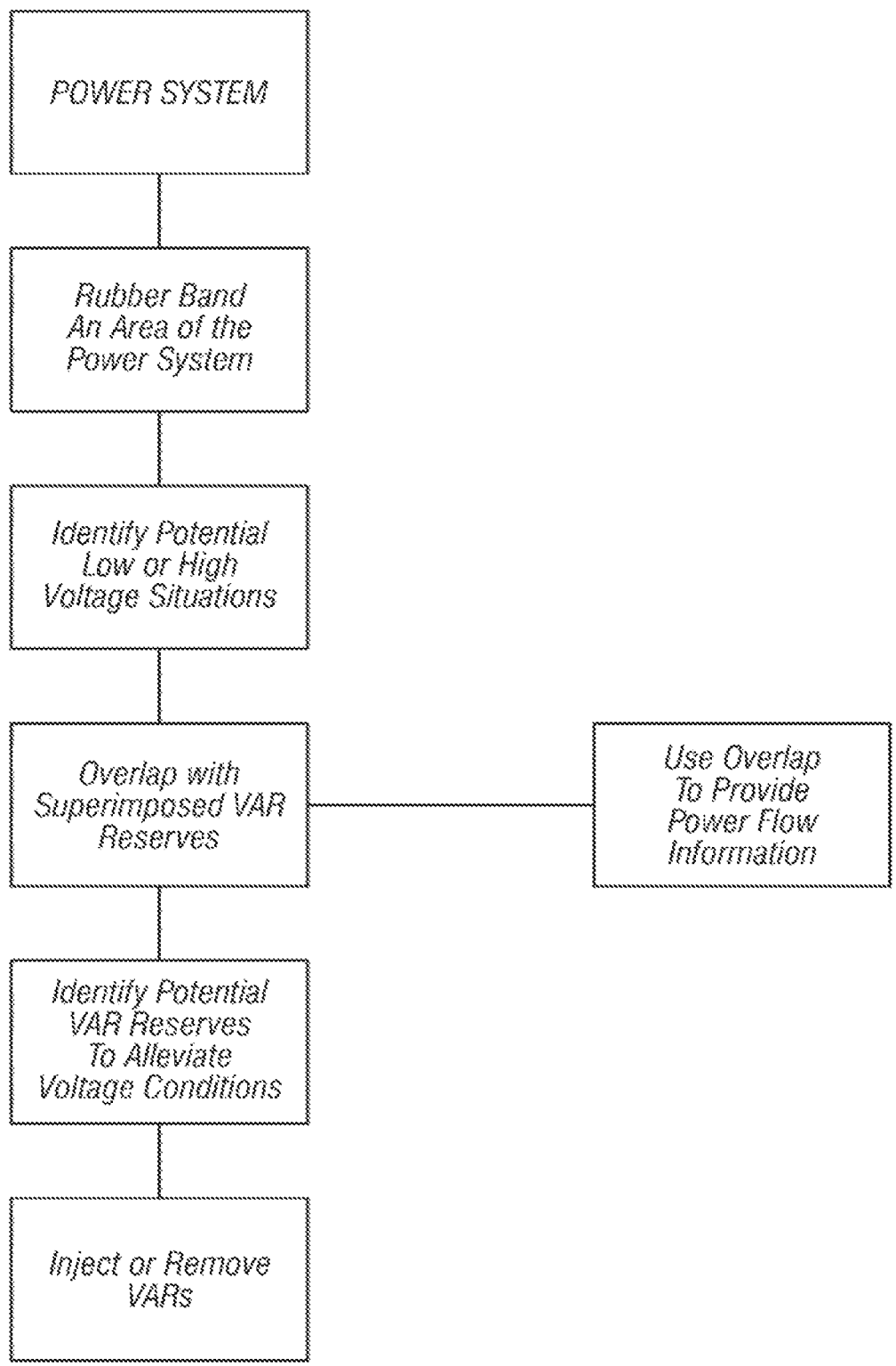
FIG. 11 is a flow chart illustrating one embodiment of a method of the present invention for managing high and low voltage conditions from selected areas of a power system of a utility company.

Referring now to FIG. 11, the present invention also provides an operator with knowledge about where and how much VAR Reserves are available. This is particularly useful for operators facing high or low voltage situations. In a such a situation the operator needs to know if there are sufficient Vars in the area where the low or high voltage condition manifests itself so that they can be injected info or removed from the power system.

In another embodiment of the present invention, a method is provided for managing high or low voltage conditions from selected areas of a power system of a utility company using VAR reserves. Selected geographic are rubber banded or lassoed and potential low or high voltage situations are identified. The control panel can include a context menu. The context menu can be used to show VAR reserves. Once the area is selected, the operator selects the option "Show Reserves" from the context menu to display the MVAR Reserves available within the area. For the selected area, all network elements are identified and a query is generated to obtain the MVAR Reserves associated with the identified network elements. Geographic displays are overlayed with superimposed VAR reserves to create overlayed geographic displays that are used to identify potential low or high voltage instances in the selected geographic areas In one embodiment, voltage contours are used to identify the potential low or high voltage instances. The overlayed geographic displays can be used to provide power flow information of the power system which can be in real time as well as to determine available VAR reserves. The geographic displays can be used to determine if there are sufficient VARS in portions or all of the selected geographic areas where low or high voltage conditions are manifest.

The location and amount of available VAR reserves is determined, and real time information relative to location and amount of available VAR reserves can be provided.

The available VAR reserves can be displayed as a summary for injection into the system and for absorption out of the system by device type, e.g., generation units, capacitor banks, reactor banks, and static Var systems). FIG. 12 shows the MVAR Reserve dashboard, which is automatically calculated based on the selected area A query can be generated to obtain MVAR reserves associated with the identified network elements.

The injection/absorption reactive reserve is calculated based on the following rules:

Generation Units: Considers only units that are not open or removed. The injection reactive reserve is (MVAR MAX−MVAR Out) and the absorption reactive reserve is (MVAR Out−MVAR Min).

Capacitor Banks: Considers only caps that are not removed from the system. The injection reactive reserve is the summation of nominal MVAR of caps that are open or disconnected. The absorption reactive reserve is the summation of nominal MVAR of caps that are closed.

Reactor Banks: Considers only reactors that are not removed from the system. The injection reactive reserve is the summation of nominal MVAR of caps that are closed. The absorption reactive reserve is the summation of nominal MVAR of caps that are open or disconnected.

Static VAR Systems: Considers only SVS that are not open or removed from the system. The injection reactive reserve is (MVAR MAX−MVAR Out) and the absorption reactive reserve is (MVAR Out−MVAR).

A stacked bar chart provides detailed information about the MVARs availability on a per-station basis and on a per-device-type, associated with the station basis. The height of the bar above the horizontal axis represents the amount or MVARs available to inject into the system from the station. The height of the bar below the horizontal axis represents the amount of MVARs available to absorb (remove) from the system at the station. For each station, the amount of MVARs that can be injected or absorbed is shown below the chart, injected/absorbed.

The chart is sorted from the station with the most available injection to the station with the least available injection. Clicking on the bar will cause the corresponding substation's one-line display to be called into the dashboard area. The operator can therefore rapidly identify which device needs to be operated on, using a familiar SCADA diagram. (Note: No control actions are allowed, the one-lines are read-only displays.)

With the present invention, it is also possible to display a 3D view of the available MVARs using the positive and negative reactive reserves toolbar buttons, as shown in FIG. 13.

The selected area can be saved in the reserves tab in the control panel and recalled for future use. Once recalled the display is automatically restored to the state when it was saved and the MVAR Reserves are updated throughout the system using the most recent real-time values.

Figure 14:
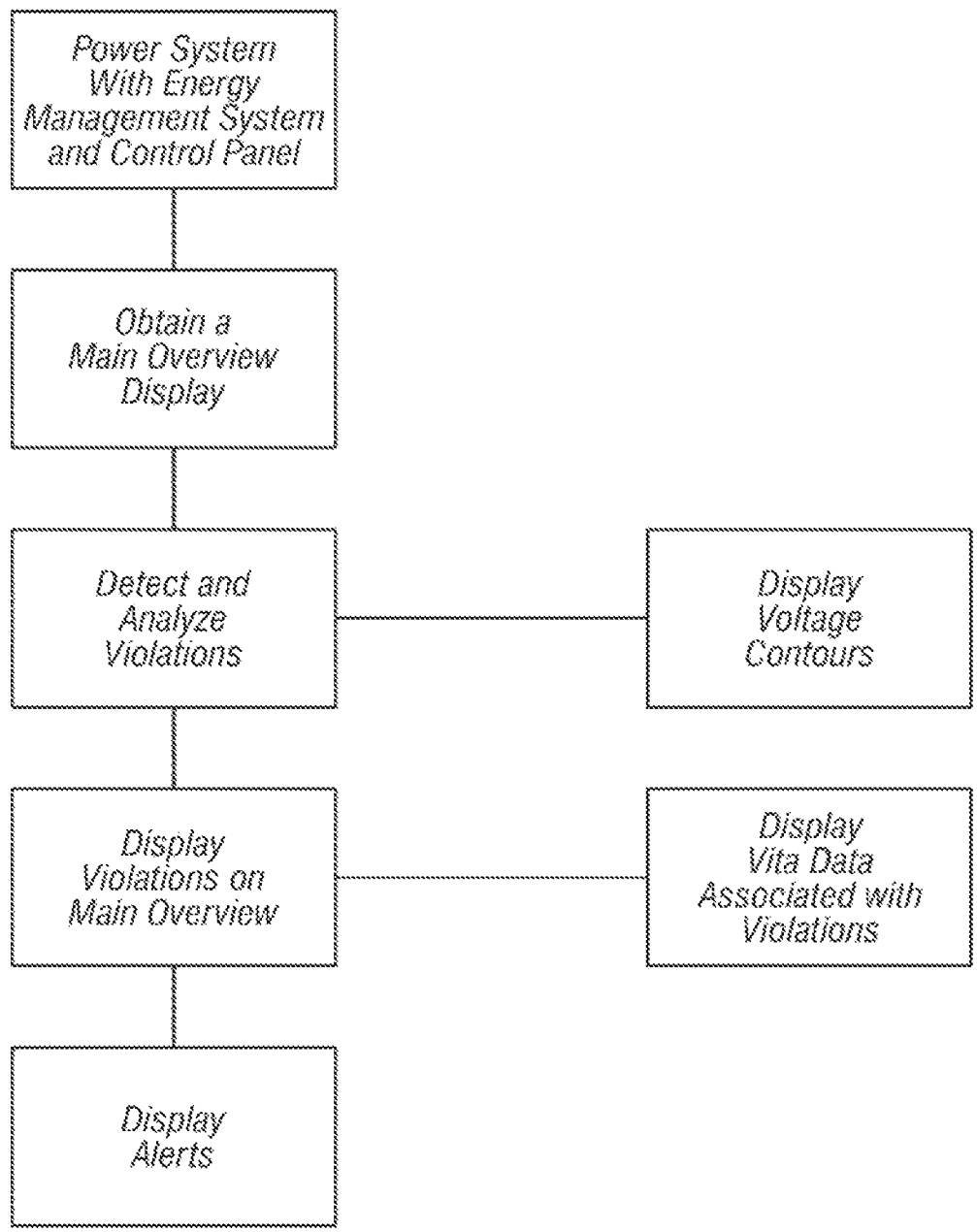
FIG. 14 is a flow chart illustrating one embodiment of a method of the present invention for assessing reliability of a power system of a utility company.
Figure 15:
FIG. 15 is associated with the FIG. 14 flow chart and illustrates that if a new violation appears following the execution of the State Estimator (SE), an alert is displayed of the viewport.

In another embodiment of the present invention, illustrated in FIG. 14, an operator can detect and analyze a base case violation using a Reliability Assessment module. If a new violation appears following the execution of the State Estimator (SE), an alert is displayed of the viewport as shown in FIG. 15.

If the letters "SE" are visible, the State Estimator has detected one or more new violations. To begin analyzing base case Violations, the operator selects the Base Case Alert button on the Alert Panel. The main Overview display is updated to show violation markers. A voltage contour at the highest KV level for which there am voltage violations is displayed. The Monitored Elements tab is updated with the list of Monitored Elements in the Alarm, Violation, or Warning State. Round Markers are used to represent violations in an overview display. The branch violation marker is presented on the center of the branch. The voltage violation markers and transformer violation markets are presented on the related substation. By way of illustration, and without limitation, examples of markers are shown below:

Red marker, with label "183.2N", representing a branch alarm for a MW value that exceeds the normal limit by 183.2% (v−limit=limit×1.832)

Red marker, with label "0.9N" on white background, representing a voltage alarm for a voltage value that exceeds the normal limit by 0.9% (v−limit=0.09×limit)

Orange marker, with label (Δ41.9E) on white background, representing a voltage drop violation for a voltage drop value that exceeds the emergency limit by 41.3% (v−limit=0.419×limit).

Red marker, with no label and white background, representing multiple violations with different violation types and at least one alarm.

The marker symbol is defined as follows:

Marker Color to represent the Violation severity threshold (warning=yellow, violation=orange, alarm=red).

Marker Fill: White background for voltage violation and/or multiple violations that have different violation types.

Label xxxS: The suffix S represents the limit being referenced ("N" for Normal, "E" for Emergency and "L" for Loadshed) and the number represents the violation percentage over this reference limit if there is a prefix with Δ, it is a voltage drop violation.

If a new violation is detected relative to the previous run, a halo is presented around the marker. The operator can now drill-down on a particular violation by selecting a violation marker. Only the selected one will appear on the display and all other violation markers will disappear. The same happens in the Monitored Element tab in the control panel, which will only show the violations associated with the current selected marker.

Figure 16:
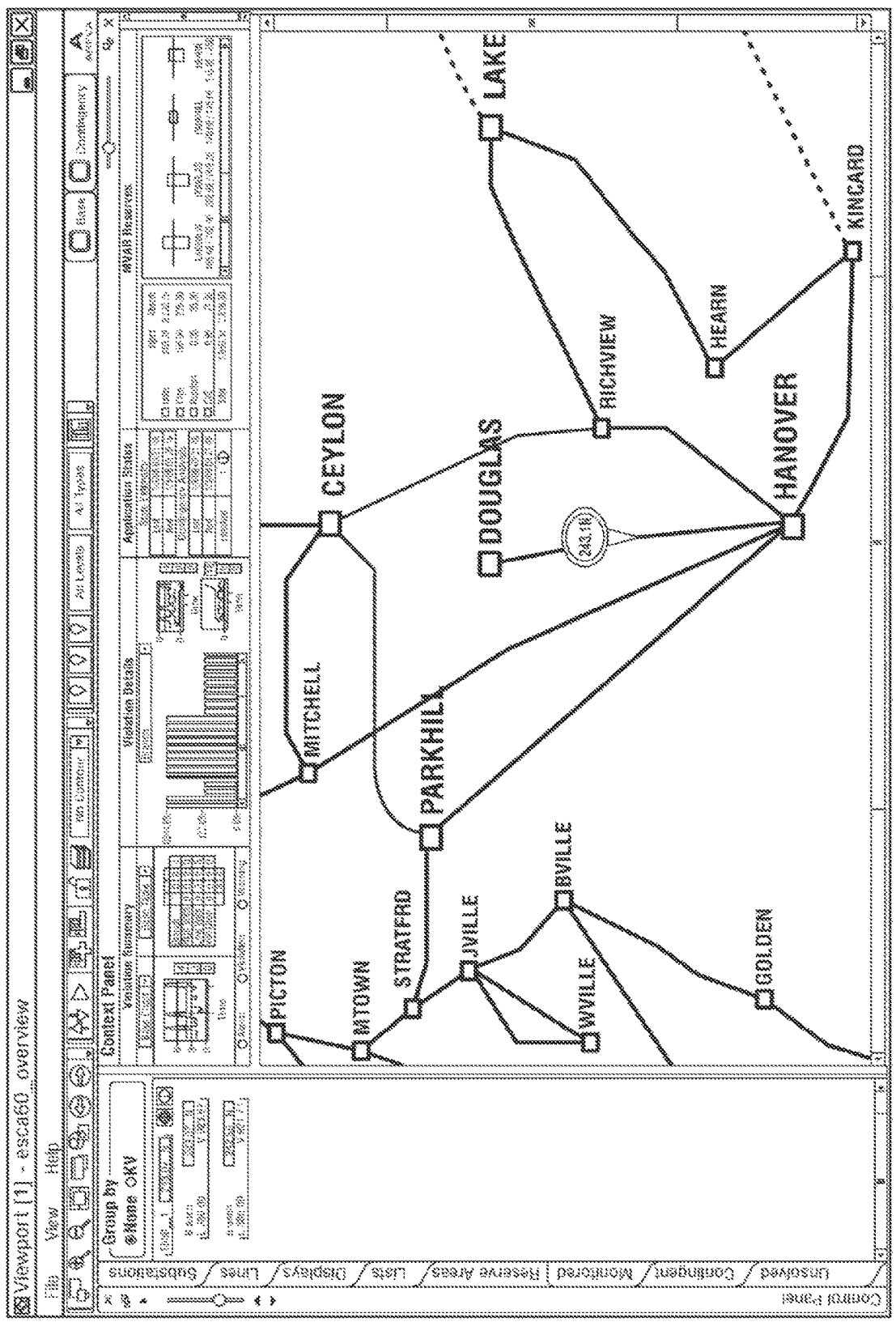
FIG. 16 is associated with the FIG. 14 flow chart and shows a selected branch.

FIG. 16 shows a selected branch Alarm on the branch DOUGLAS-HANOVER. The control panel on the left is automatically open on the list of monitored elements and positioned on this branch. The control panel monitored element list shows the vital data related to all violations selected in the overview display. For each monitored element, the name and the highest percent over the limit value being violated is displayed on the top line.

By way of illustration, and without limitation, details for each violation can include;

The limit value, displayed as "Lxxx.xx"
The current value, displayed as "Vxxx.xx"
The percentage over the limit it violates.

In case of a branch, there might be two entries, one for each end of the branch.

There can be two icons for each Monitored element in violation: one for locating the element on the overview displays and one for calling the associated line display in a dashboard tab to obtain more information.

In one embodiment of the present invention, an operator can detect and analyze a contingency case violation using a Reliability Assessment module. If a new violation appears following the execution of the Contingency Analysis (CA), an alert is displayed on the top right corner as shown in FIG. 15. The operator selects the contingency alert button to begin analyzing Post Contingency Violations, Elements in Alarm, Violation, or Warning States as calculated by CA. The Contingent Tab in the Control Panel is updated with the list of contingencies impacting Monitored Elements in violations.

The material presented on the Overview display is very similar for the base case with the addition of being able to:
display contingency-related information, and
visualize and assess the relationship between monitored elements and contingencies.

Using combinations of the Overview display, the Control Panel, and the Violation toolbar filters, the operator can drill down the Post Contingency Case violations in both a graphical and a list format.

Figure 17:
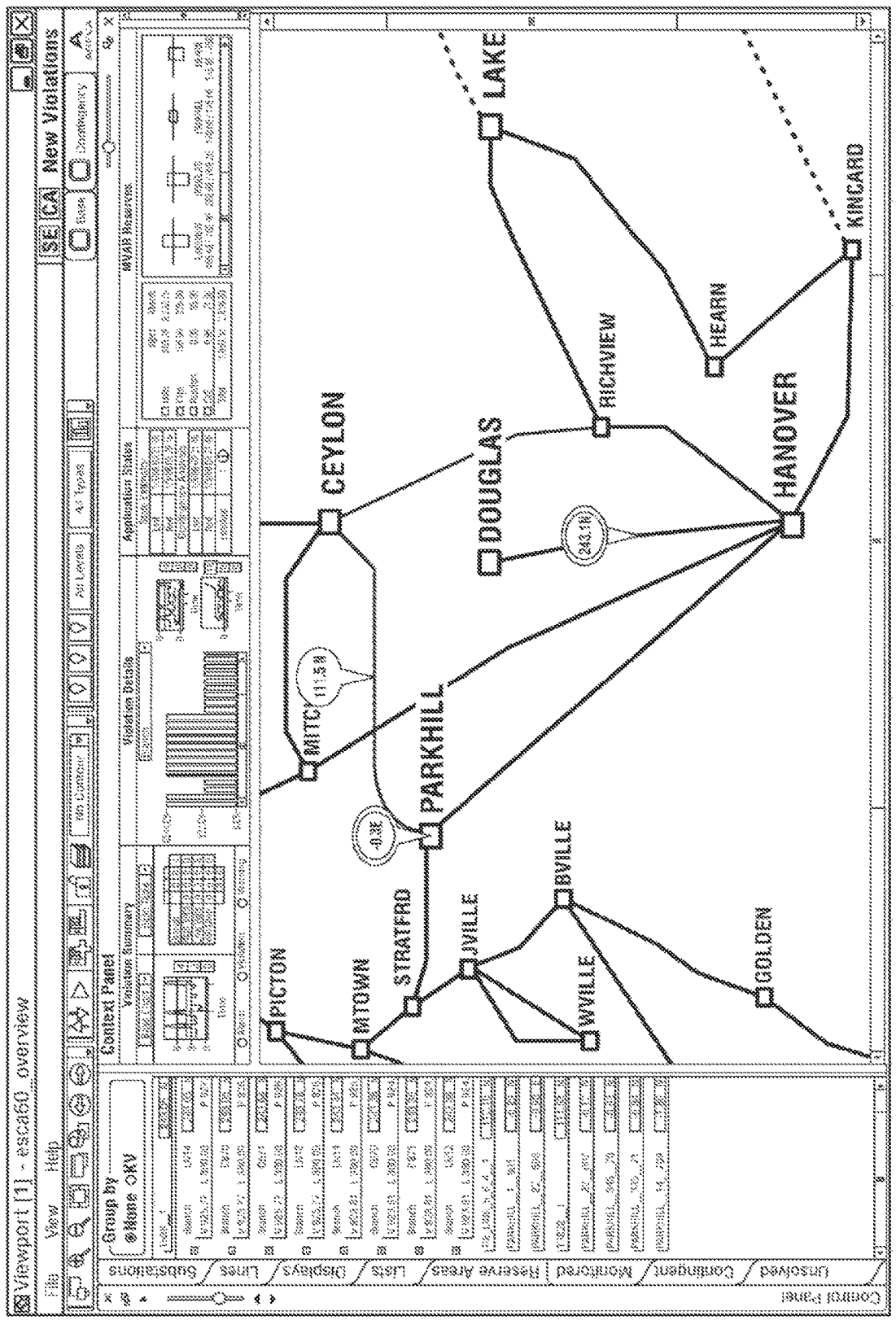
FIG. 17 is associated with the FIG. 14 flow chart and shows how markers associated with the monitored elements in post contingency violations are displayed.

As shown in FIG. 17, markers associated with the monitored elements in post contingency violations are displayed.

The violation markers associated with the monitored elements on the overview display in the post contingency case have the same meaning as the marker in lie base case.

Figure 18:
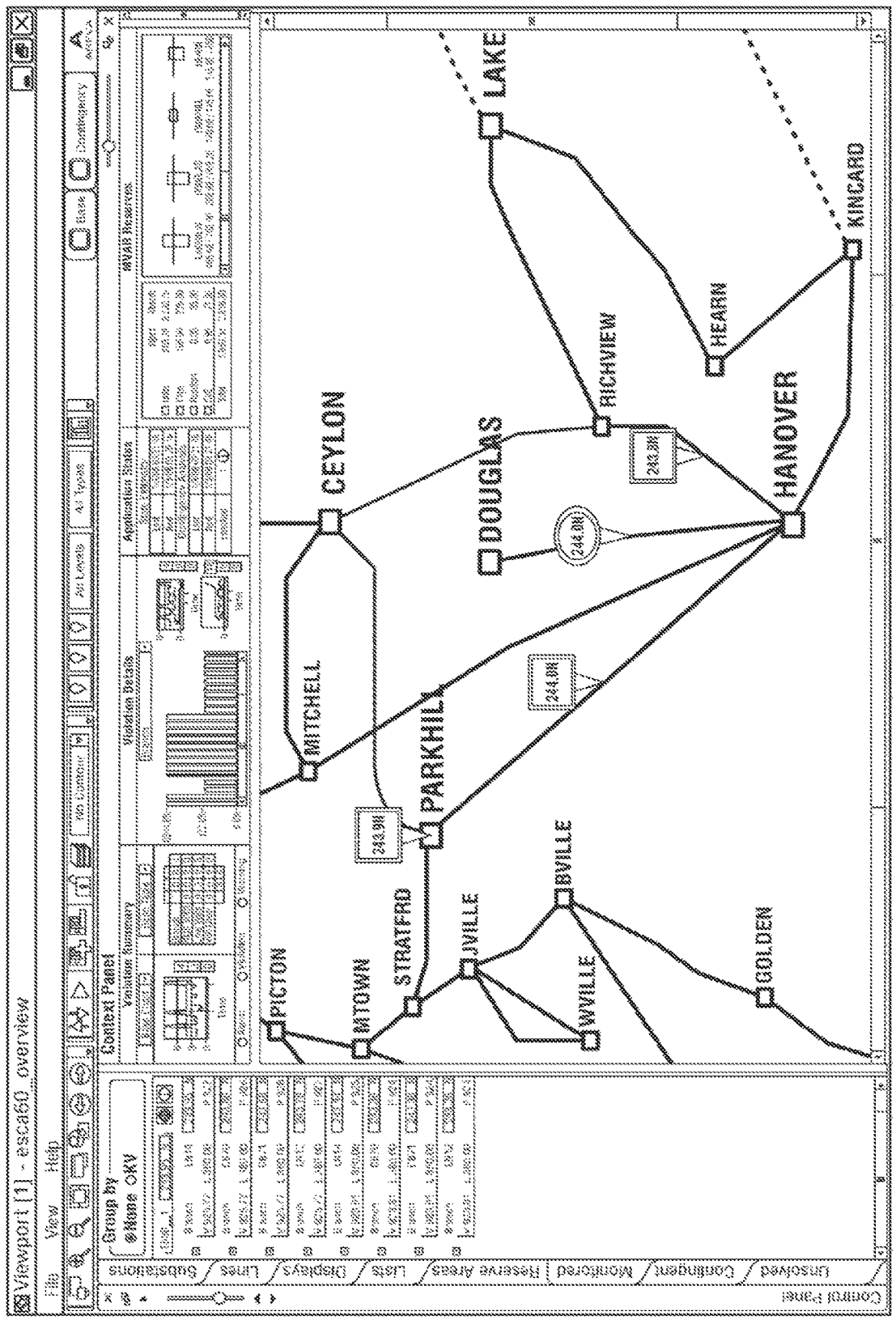
FIG. 18 is associated with the FIG. 14 flow chart and shows that to drill down into a particular violation, the operator can select a violation marker for an Alarm on branch.

To drill down into a particular violation, the operator selects a violation marker, as shown in FIG. 18 below, for the Alarm on branch DOUGLAS-HANOVER.

The control panel shows the element monitored with the following information:
Name of the monitored element;
Type of violation;
Base Case Value (letter "V" in front of the value);
Post Contingency Value (letter "P" in front of the value);
Limit Value associated with the Alarm, Violation, or Warning being presented; and
Percent over the limit (N: Normal, E: Emergency, L: Loadshed).

Figure 19:
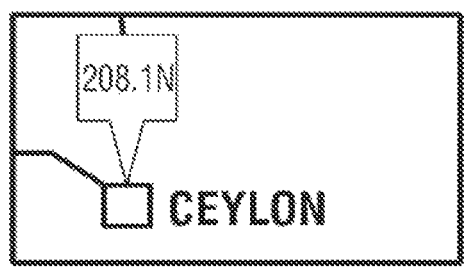
FIG. 19 is associated with the FIG. 14 flow chart and illustrates that when a contingent element creates a violation, a square marker can be provided.

A contingent element is a power system element that represents a defined contingency in the CA application. When this contingent element creates a violation, a square marker, as shown in FIG. 19, appears on the branch or substation. The same principles as for violation markers apply:

As shown, color can be used to represent a violation's severity (worst created by the contingent element in case of multiple violations), as follows:
White background: Voltage violation; and
No background: Branch violation.

Labe describes the worst violation in the same way as on a Violation marker.

Figure 20:
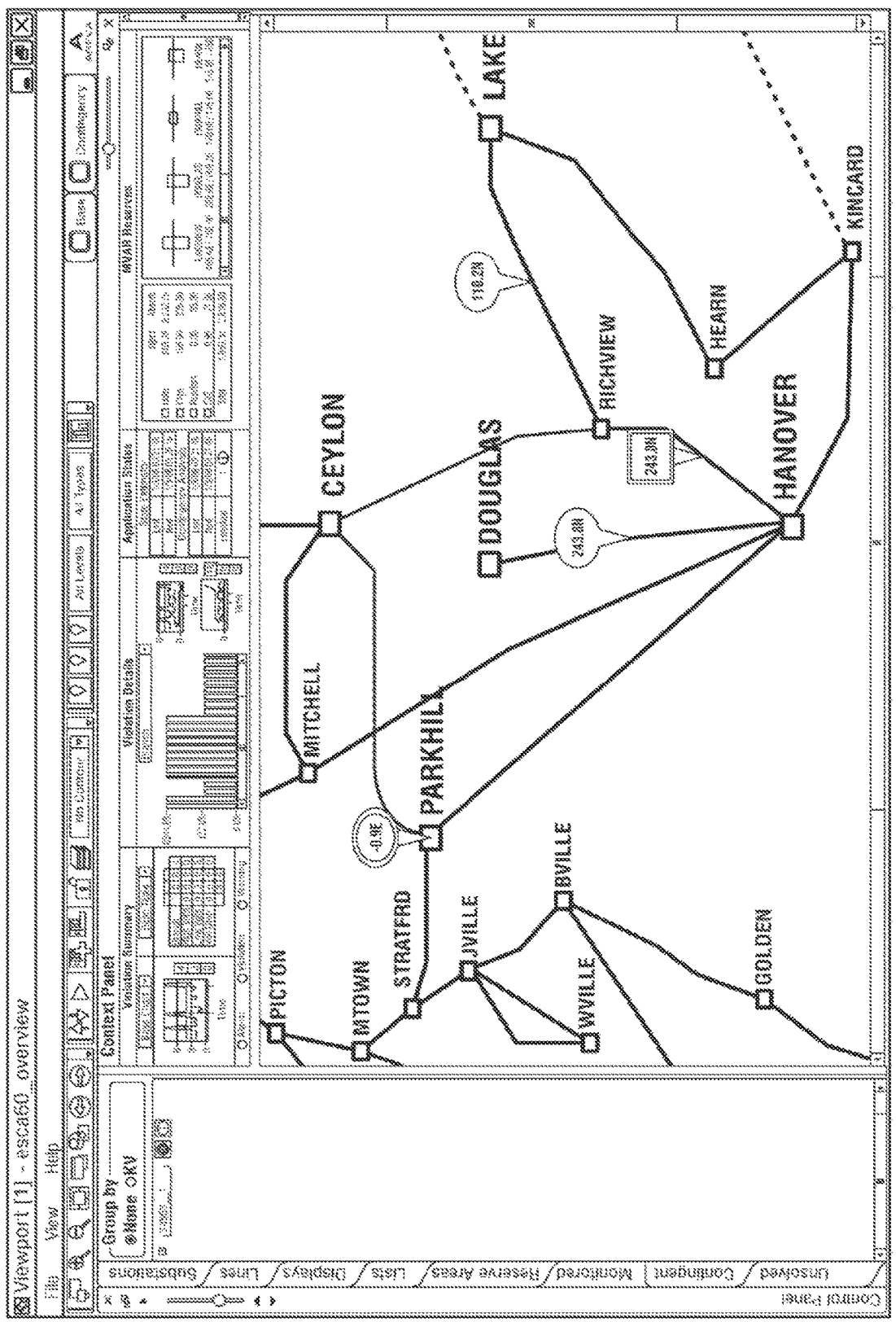
FIG. 20 is associated with the FIG. 14 flow chart and illustrates that selecting a contingent element marker can cause a display all violations that a particular contingent element creates.

As shown in FIG. 20, selecting a contingent element marker will display all violations that this particular contingent element creates. The Contingency tab will be automatically opened and show a list of contingencies that are impacting the monitored elements in Alarm, Violation, or Warning states (refer to the Monitored Elements tab).

Figure 21:
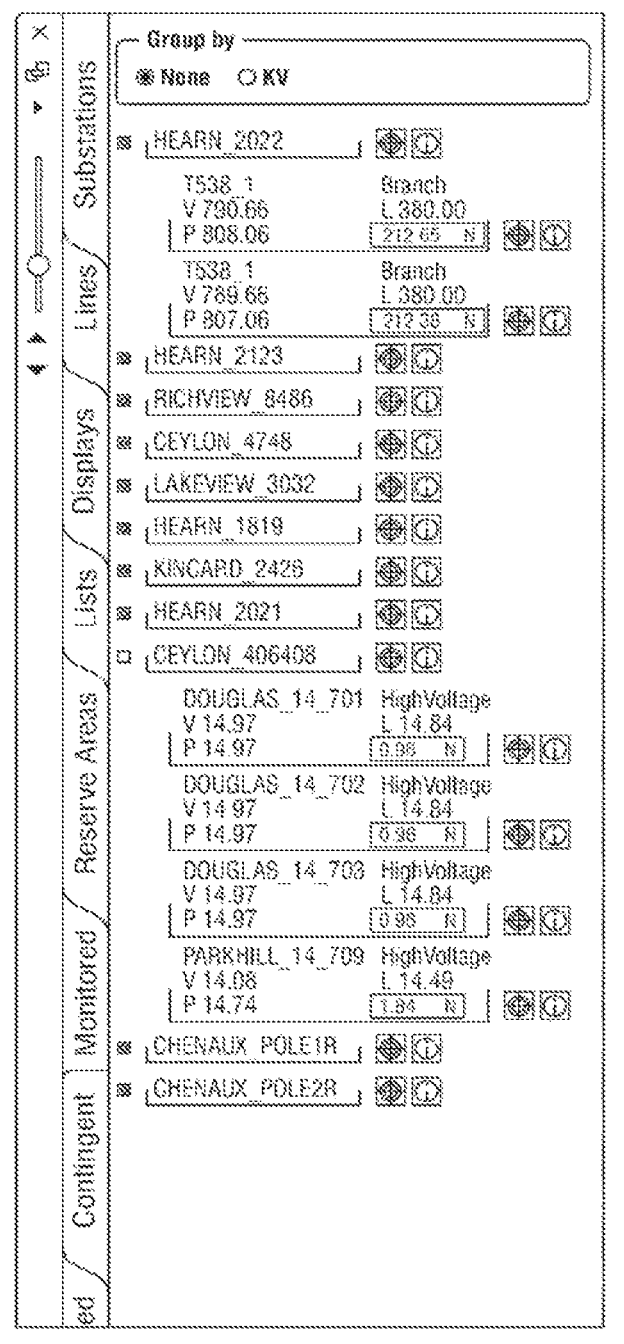

FIG. 21 shows the Contingency Tab in the control panel.

In one embodiment, for each contingency in the tab, the name is presented as a tab item. Two icons are next to the name. One icon locates the contingent element(s) on the overview display, and the other icon calls an associated display in a dashboard tab. You can obtain detailed information related to the contingency by expanding the tree (i.e., click on the "+" sign to the left of the name). The expanded contingent item will display a list of monitored elements it impacts. They are sorted using the same criteria as the monitored elements in the Monitored Elements Tab.

Other embodiments of the invention will be apparent to those skilled in the an from consideration of the specification and practice of the invention disclosed herein. It is intended that the specification and examples be considered as exemplary only, with a true scope and spirit of the invention being indicated by the following claims.

What is claimed is:

1. A method, comprising:
rubber-banding selected geographic areas-of-interest from an electronic display, wherein low and high voltage conditions of the selected geographic areas-of-interest are desired to be managed using volt ampere reactive (VAR) reserves available;
determining, by a system comprising a processor, locations and amounts of the VAR reserves available in a power generating system within the selected rubber-banded geographic area, the locations and amounts of VAR reserves available being for generation units, capacitor banks, reactor banks, and static VAR systems of the power generating system; and
generating at least one user interface that includes the selected rubber-banded geographic areas-of-interest, the interface comprising elements indicating the locations and the amounts of the VAR reserves available in the power generating system;
wherein the selected rubber-banded geographic areas-of-interest are presented at the user interface as a background layer representing the physical geography of the area-of-interest and wherein the amounts of VAR reserves are superimposed over the background layer.

2. The method of claim 1, wherein the determining the amounts of the VAR reserves comprises determining an amount of VAR reserves available in the power generating system for a generation unit, and
wherein the determining the amount of the VAR reserves for the generation unit comprises determining an injection reactive reserve of the generation unit that is a mega VAR (MVAR) maximum of the generation unit minus a MVAR output of the generation unit, and determining an absorption reactive reserve of the generation unit that is the MVAR output of the generation unit minus a MVAR minimum of the generation unit.

3. The method of claim 1, wherein the determining the amounts of the VAR reserves comprises determining an amount of VAR reserves available in the power generating system for a capacitor bank, and
wherein the determining the amount of the VAR reserves for the capacitor bank comprises determining an injection reactive reserve of the capacitor bank that is a first summation of nominal mega VAR (MVAR) of capacitors of the capacitor bank that are open or disconnected, and determining an absorption reactive reserve of the capacitor bank that is a second summation of nominal MVAR of capacitors of the capacitor bank that are closed.

4. The method of claim 1, wherein the determining the amounts of the VAR reserves comprises determining an amount of VAR reserves available in the power generating system for a reactor bank, and
wherein the determining the amount of the VAR reserves for the reactor comprises determining an injection reactive reserve of the reactor bank that is a first summation of nominal mega VAR (MVAR) of capacitors of the reactor bank that are closed, and determining an absorption reactive reserve of the reactor bank that is a second summation of nominal MVAR of capacitors of the reactor bank that are open or disconnected.

5. The method of claim 1, wherein the determining the amounts of the VAR reserves comprises determining an amount of VAR reserves available in the power generating system for a static VAR system, and
wherein the determining the amount of the VAR reserves the static VAR system comprises determining an injection reactive reserve of the static VAR system that is a mega VAR (MVAR) output of the static VAR system minus a MVAR minimum of the static VAR system, and determining an absorption reactive reserve of the static VAR system that is a MVAR maximum of the static VAR system minus a second MVAR output of the static VAR system.

6. The method of claim 1, wherein the locations and the amounts of the VAR reserves available in the power generating system are determined in real-time during operation of the power generating system for generating power.

7. The method of claim 1, further comprising applying highlighting to the at least one user interface on geographic areas having insufficient VAR reserves.

8. A system, comprising:
a memory that stores executable components; and
a processor, communicatively coupled to the memory, that executes or facilitates execution of the executable components to perform operations, comprising:
receiving selected rubber-banded geographic areas-of-interest, wherein low and high voltage conditions of the selected geographic areas-of-interest are desired to be managed using volt ampere reactive (VAR) reserves available;
determining locations and amounts of the VAR reserves available in a power generating system within the selected rubber-banded geographic areas-of-interest, the locations and amounts of VAR reserves available being for generation units, capacitor banks, reactor banks, and static VAR systems of the power generating system; and
generating at least one user interface that includes the selected rubber-banded geographic areas-of-interest, the interface comprising elements indicating the locations and the amounts of the VAR reserves available in the power generating system;
wherein the selected rubber-banded geographic areas-of-interest are presented at the user interface as a background layer representing the physical geography of the area-of-interest and wherein the amounts of VAR reserves are superimposed over the background layer.

9. The system of claim 8, wherein the determining the amounts of VAR reserves comprises determining an amount of VAR reserves available in the power generating system for a generation unit, and
wherein the determining the amount of VAR reserves for the generation unit comprises determining an injection reactive reserve of the generation unit that is a mega VAR (MVAR) maximum of the generation unit minus a MVAR output of the generation unit, and determining an absorption reactive reserve of the generation unit that is the MVAR output of the generation unit minus a MVAR minimum of the generation unit.

10. The system of claim 8, wherein the determining the amounts of VAR reserves comprises determining an amount of VAR reserves available in the power generating system for a capacitor bank, and
wherein the determining the amount of VAR reserves for the capacitor bank comprises determining an injection reactive reserve of the capacitor bank that is a first summation of nominal mega VAR (MVAR) of capacitors of the capacitor bank that are open or disconnected, and determining an absorption reactive reserve of the capacitor bank that is a second summation of nominal MVAR of capacitors of the capacitor bank that are closed.

11. The system of claim 8, wherein the determining the amounts of VAR reserves comprises determining an amount of VAR reserves available in the power generating system for a reactor bank, and wherein the determining the amount of VAR reserves for the reactor bank comprises determining an injection reactive reserve of the reactor bank that is a first summation of nominal mega VAR (MVAR) of capacitors of the reactor bank that are closed, and determining an absorption reactive reserve of the reactor bank that is a second summation of nominal MVAR of capacitors of the reactor bank that are open or disconnected.

12. The system of claim 8, wherein the determining the amounts of VAR reserves comprises determining an amount of VAR reserves available in the power generating system for a static VAR system, and wherein the determining the amount of VAR reserves for the static VAR system comprises determining an injection reactive reserve of the static VAR system that is a mega VAR (MVAR) output of the static VAR system minus a MVAR minimum of the static VAR system, and determining an absorption reactive reserve of the static VAR system that is a MVAR maximum of the static VAR system minus a second MVAR output of the static VAR system.

13. The system of claim 8, wherein the locations and the amounts of the VAR reserves available in the power generating system are determined dynamically during operation of the power generating system for generating power.

14. The system of claim 8, the operations further comprising highlighting the at least one user interface at geographic areas having insufficient VAR reserves.

15. A non-transitory computer-readable medium having instructions stored thereon that, in response to execution, cause a system including a processor to perform operations comprising:

receiving selected rubber-banded geographic areas-of-interest, wherein low and high voltage conditions of the selected geographic areas-of-interest are desired to be managed using volt ampere reactive (VAR) reserves available;

determining locations and amounts of the VAR reserves available in a power generating system within the selected rubber-banded geographic areas-of-interest, the locations and amounts of VAR reserves available being for generation units, capacitor banks, reactor banks, and static VAR systems of the power generating system; and generating at least one user interface that includes the selected rubber-banded geographic areas-of-interest, the interface comprising element indicating at least one location of the locations and at least one amount of the amounts of the VAR reserves available in the power generating system;

wherein the selected rubber-banded geographic areas-of-interest are presented at the user interface as a background layer representing the physical geography of the area-of-interest and wherein the amounts of VAR reserves are superimposed over the background layer.

16. The non-transitory computer-readable medium of claim 15, wherein the determining the amounts of VAR reserves comprises determining an amount of VAR reserves available in the power generating system for a generation unit, and wherein the determining the amount of VAR reserves for the generation unit comprises determining an injection reactive reserve of the generation unit that is a mega VAR (MVAR) maximum of the generation unit minus a MVAR output of the generation unit, and determining an absorption reactive reserve of the generation unit that is the MVAR output of the generation unit minus a MVAR minimum of the generation unit.

17. The non-transitory computer-readable medium of claim 15, wherein the determining the amounts of VAR reserves comprises determining an amount of VAR reserves available in the power generating system for a capacitor bank, and wherein the determining the amount of VAR reserves for the capacitor bank comprises determining an injection reactive reserve of the capacitor bank that is a summation of nominal mega VAR (MVAR) of capacitors of the capacitor bank that are open or disconnected, and determining an absorption reactive reserve of the capacitor bank that is a summation of nominal MVAR of capacitors of the capacitor bank that are closed.

18. The non-transitory computer-readable medium of claim 15, wherein the determining the amounts of VAR reserves comprises determining an amount of VAR reserves available in the power generating system for a reactor bank, and wherein the determining the amount of VAR reserves for the reactor bank comprises determining an injection reactive reserve of the reactor bank that is a summation of nominal mega VAR (MVAR) of capacitors of the reactor bank that are closed, and determining an absorption reactive reserve of the reactor bank that is a summation of nominal MVAR of capacitors of the reactor bank that are open or disconnected.

19. The non-transitory computer-readable medium of claim 15, wherein the determining the amounts of VAR reserves comprises determining an amount of VAR reserves available in the power generating system for a static VAR system, and wherein the determining the amount of VAR reserves for a static VAR system comprises determining an injection reactive reserve of the static VAR system that is a mega VAR (MVAR) output of the static VAR system minus a MVAR minimum of the static VAR system, and determining an absorption reactive reserve of the static VAR system that is a MVAR maximum of the static VAR system minus a second MVAR output of the static VAR system.

20. The non-transitory computer-readable medium of claim 15, wherein the locations and the amounts of the VAR reserves available in the power generating system are determined on the fly during operation of the power generating system for generating power.

* * * * *